(12) United States Patent
Marino et al.

(10) Patent No.: US 8,498,094 B2
(45) Date of Patent: Jul. 30, 2013

(54) SEMICONDUCTOR VARIABLE CAPACITOR

(75) Inventors: Fabio Alessio Marino, San Jose, CA (US); Paolo Menegoli, San Jose, CA (US)

(73) Assignee: ETA Semiconductor Inc., San Jose, CA (US)

( * ) Notice: Subject to any disclaimer, the term of this patent is extended or adjusted under 35 U.S.C. 154(b) by 224 days.

(21) Appl. No.: 13/068,161

(22) Filed: May 5, 2011

(65) Prior Publication Data
US 2012/0281336 A1 Nov. 8, 2012

(51) Int. Cl.
*H01G 7/00* (2006.01)

(52) U.S. Cl.
USPC ........... 361/277; 361/272; 361/278; 361/279; 361/283.3; 361/290

(58) Field of Classification Search
USPC ................. 361/277, 272, 273, 278, 279, 280, 361/281, 283.3, 290–292
See application file for complete search history.

(56) References Cited

U.S. PATENT DOCUMENTS

| | | | |
|---|---|---|---|
| 3,829,743 A | 8/1974 | Kohashi | |
| 5,982,608 A * | 11/1999 | Kalnitsky et al. | 361/288 |
| 6,228,696 B1 * | 5/2001 | Nguyen et al. | 438/217 |
| 6,407,412 B1 * | 6/2002 | Iniewski et al. | 257/107 |
| 7,247,918 B2 * | 7/2007 | Tateyama | 257/401 |
| 7,403,140 B2 | 7/2008 | Miyagi et al. | |
| 7,440,254 B2 * | 10/2008 | Gallant | 361/277 |
| 7,622,760 B2 | 11/2009 | Ogawa et al. | |
| 8,234,417 B2 * | 7/2012 | Kottomtharayil et al. | 710/16 |
| 2005/0093000 A1 * | 5/2005 | Tanimoto et al. | 257/77 |

* cited by examiner

Primary Examiner — Nguyen T Ha

(57) ABSTRACT

A novel semiconductor variable capacitor is presented. The semiconductor structure is simple and is based on a semiconductor variable MOS capacitor structure suitable for integrated circuits, which has at least three terminals, one of which is used to modulate the equivalent capacitor area of the MOS structure by increasing or decreasing its DC voltage with respect to another terminal of the device, in order to change the capacitance over a wide ranges of values. Furthermore, the present invention decouples the AC signal and the DC control voltage avoiding distortion and increasing the performance of the device, such as its control characteristic. The present invention is simple and only slightly dependent on the variations due to the fabrication process. It exhibits a high value of capacitance density and, if opportunely implemented, shows a linear dependence of the capacitance value with respect to the voltage of its control terminal.

10 Claims, 21 Drawing Sheets

SEMICONDUCTOR VARIABLE CAPACITOR

BACKGROUND OF THE INVENTION

1. Field of the Invention

The present invention is in the field of semiconductor structures. The present invention is further in the field of semiconductor structures of variable capacitance devices. Particularly, it relates to a MOS type variable capacitance device for semiconductor circuits. The implementation is not limited to a specific technology, and applies to either the invention as an individual component or to inclusion of the present invention within larger systems which may be combined into larger integrated circuits.

2. Brief Description of Related Art

Semiconductor capacitors are one of the fundamental components for integrated circuits. A variable capacitor is a capacitor whose capacitance may be intentionally and repeatedly changed under the influence of DC bias voltages. Variable capacitors are often used in L-C circuits to set the resonance frequency, e.g. to tune a radio (therefore they are sometimes called tuning capacitors), or as a variable reactance, e.g. for impedance matching in antenna tuners:

A voltage-controlled capacitor is well known in the art as "varactor", in which the thickness of a depletion region formed in a pn-junction diode is varied by changing a reverse bias voltage to alter the junction transition capacitance. Any junction diode exhibits this effect (including pn-junctions in transistors), but devices used as variable capacitance diodes are designed with a large junction area and a doping profile specifically chosen to maximize capacitance.

Their use is limited to low signal amplitudes to avoid obvious distortions as the capacitance would be affected by the change of signal voltage, precluding their use in the input stages of high-quality RF communications receivers, where they would add unacceptable levels of inter-modulation. At VHF/UHF frequencies, e.g. in FM Radio or TV tuners, dynamic range is limited by noise rather than large signal handling requirements, and varicaps are commonly used in the signal path. Furthermore an extremely high value of capacitance cannot be obtained even with a reverse bias because the reverse-biased saturation current is not exactly equal to zero.

Varicaps are used for frequency modulation of oscillators, and as reported in Miyagi et al. (U.S. Pat. No. 7,403,140) to make high-frequency voltage controlled oscillators (VCOs), the core component in phase-locked loop (PLL) frequency synthesizers that are ubiquitous in modern communications equipment. It is intended for antenna impedance matching in multi-band GSM/WCDMA cellular handsets and mobile TV receivers that must operate over wide frequency ranges such as the European DVB-H and Japanese ISDB-T mobile TV systems.

Several prior art attempts to improve varactors performance, so as to effectively obtain high capacitance density and a linear dependence of the capacitance value over a wide range of control voltages, have been documented. In particular, an interesting solution is reported in Ogawa et al. (U.S. Pat. No. 7,622,760) where the synthesis of two MOS capacitor is used to obtain a good linearity over a wide range relative to the DC control voltage. However, the prior art described above discloses a varactor that is still a two terminal device, and its capacitance is varied imposing a DC voltage between its two terminals. This leads to the disadvantage that the AC voltage is superimposed upon the DC control value, and therefore the capacitance value is distorted by the AC voltage.

There is therefore a need of a novel variable capacitor with at least three terminals, where at least one control terminal separated from the capacitance terminals is added. The novel structure should allow the control of the capacitance without overlapping the DC control voltage with the AC signal avoiding the distortion of the capacitance value during the circuit operation. This device differently from the prior art described above, should use the voltage of the control terminal to modulate the area of a MOS capacitance rather than the distance between the two equivalent electrodes of a pn-junction capacitor. Accordingly, the value of stored charge of the present device can be determined by the thickness of the dielectric layer and therefore can be much higher than that of the prior-art devices utilizing the junction-transition capacitance.

A similar approach, where a three terminal MOS varactor is used, is disclosed in Kohashi (U.S. Pat. No. 3,829,743). In this patent the author describes a variable capacitance device having a thin film of dielectric material and in which the area of an equivalent plate electrode is varied by changing the voltage of the control terminal or under the influence of radiations.

Referring to the drawings in Kohashi and more particularly to FIG. 1 and FIG. 2 of the document, the variable capacitance device comprises a pn-junction diode placed directly above the dielectric film and a source of DC voltage. A lead wire made of gold or aluminum is placed in ohmic contact with an end surface of each of the p and n regions. One lead is connected to the movable contact of a double-throw switch. The double-throw switch has two fixed contacts connected to two batteries, which in turn are connected together to the other lead placed in electrical contact with the n region.

As shown, a thin film of high-insulation, low-dielectric-loss dielectric material is deposited on the side surface of the diode perpendicular to the junction.

The described device uses the voltage between the n and the p regions of the pn-junction to modulate the depletion region above the oxide in order to change the overlap surface between the p and n regions with the metal plate under the oxide layer. FIG. 3 of the cited patent shows the structure resulting by the parallel of two structures as presented in FIG. 1.

The described structures can be used only for discrete components. As underlined by the author himself in the patent, they are not suitable for integrated circuits. The integrated version of the structure shown in FIG. 1 is reported in FIG. 4. In this case, as in the previous one, both the depletion regions in the p and n regions are used to modulate the capacitance, which lead to a difficult control of the device performance and capacitance-voltage relation (the process variations of the p-region sum up with the one of the N region and to the variability on the position of the pn-junction).

Furthermore, in all these structures, the DC voltage is applied between one terminal of the capacitance and a region directly in contact with the capacitance dielectric layer overlapping the metal terminal 27 in FIG. 1 (or 45 in FIG. 3), causing a distortion of the capacitance value due to the modulation of the MOS capacitance. Varying the DC voltage between the p and n regions, also the DC voltage drop between one of these two regions and the metal terminal changes, and that causes an enhancement or depletion of the semiconductor surface affecting the capacitance value.

The last structure of interest disclosed in Kohashi is the one illustrated in FIG. 14 of the document. In this case the variable capacitance is the resulting synthesis of the series of the capacitances of the pn-junctions and a MOS structure. The capacitance terminals 190 and 193 are coupled through a p+/n junction and the MOS capacitance. In this case the resulting capacitance and its range of variation are therefore very low. Furthermore, in this configuration the capacitance depends also on the thickness of the depletion regions of the two p+/n junction as in conventional diode based varactors, leading to a high distortion of the capacitance value. Finally, it is important to notice that none of the structures described in Kohashi have a linear relation between the control voltage and the capacitance value.

The present invention is simple and much less sensitive to process variation with respect the structures described above. It is suitable for integrated circuits and presents a high capacitance density value. In the present invention the variation of the DC control voltage does not affect the voltage applied between the two capacitance plates, which enables an extremely good control of the device characteristic. Furthermore, if appropriately designed, the present invention exhibits a linear dependence of the capacitance over a wide range of control voltage values. All these characteristics are extremely important for the practical implementation of the present invention and clearly distinguish the present invention from the varactors devices used nowadays in the integrated-electronic industry.

It is a purpose of the present invention to describe a novel structure of a semiconductor variable capacitor suitable for integrated circuits with at least three terminals, simple and slightly sensible to process variations, which offers the advantage of much higher capacitance per unit area, wider control ranges, and without distortion of the capacitance value due to the AC signal. Furthermore the present invention, if opportunely implemented, presents a linear dependence of the capacitance with respect to the voltage of the control terminal.

SUMMARY OF THE INVENTION

The present invention describes a semiconductor variable capacitor MOS structure suitable for integrated circuits, which has at least three terminals, one of which is used to modulate the equivalent capacitor area of the MOS structure by increasing or decreasing its DC voltage with respect to another terminal of the device, in order to change the capacitance over a wide range of values. Furthermore, the present invention decouples the AC signal and the DC control voltage avoiding distortions and increasing the performance of the device, such as control reliability. The present invention is simple and only slightly dependent on the variations related to the fabrication process. It exhibits a high value of capacitance density and, if opportunely implemented, shows a linear dependence of the capacitance value with respect to the control voltage.

In order to better understand this concept, let us consider the structure illustrated in FIG. 1, which represents a cross-section of the first embodiment of the present invention. As it can be seen, the semiconductor device illustrated has three terminals: the control terminal 4, the C2 terminal 8, and the C1 terminal 1. The two terminals 1 and 8 are associated to the variable capacitance and are named C1 and C2, respectively, whereas the control terminal 4 is used to modulate the capacitance value.

As it can be seen the structure is very simple and is obtained from a MOS capacitor by simply adding a n+ implantation 5 in the substrate 6. Furthermore, the present invention utilizes a MOS capacitance instead of a pn-junction as most of the common varactors, achieving high capacitance density values.

Assuming that the C2 terminal is connected to ground, if the control voltage of the control terminal 4 is set to 0V, the depletion region of the pn-junction, formed by the region 5 and the substrate 6, is very small. It follows that the capacitance between the C1 terminal 1 and the substrate will have its maximum value of:

$$C = \frac{\varepsilon_{ox}}{d} W * L,$$

where $\varepsilon_{ox}$ and d are the dielectric constant and the thickness of the insulating layer, respectively, W is the width of the MOS capacitor and L is its length.

If the control voltage of the control terminal is increased, the depletion region of the pn-junction widens under the dielectric layer 3 reducing the area of the equivalent electrode formed by the p-substrate, and with it the effective capacitance area and value. Vice-versa, by decreasing the control voltage from 2V to zero, as an example, the depletion region of the pn-junction is reduced, leading to an increase of the capacitance.

Differently from conventional MOS capacitors and prior art varactors described above, where the capacitance between the two main terminals is defined only by the DC polarization applied through the capacitance, in the present invention the capacitance value is determined by the polarization of the third terminal 4 which modulates the depletion region under the dielectric layer 3 increasing or decreasing the equivalent surface of the capacitance between the p substrate and the C1 terminal.

The capacitance value depends only on the depletion region of the p substrate, which is uniform and well controllable. This characteristic reduces dramatically the device dependence on the process variations. Furthermore, the variation of the DC voltage of the control terminal 4 does not alter the DC voltage between the two terminals of the capacitance, neither alters the DC voltage between any region directly in contact with the dielectric layer, allowing a perfect control of the device characteristic.

In general, the capacitance between the C1 and C2 terminals can be expressed as:

$$C = \frac{\varepsilon_{ox}}{d} W * [L - (x_p - x_L)],$$

where $x_p$ is the depletion region extension in the p-substrate created by the pn-junction formed by the p substrate 6 with the n+ regions 5, and $x_L$ (assumed to be smaller than $x_p$ in the previous formula) is the distance between the n+ region 5 and the capacitance terminal 2.

The extension $x_d$ of the depletion region generated from a pn-junction is proportional to the square root of the voltage V applied between the n and the p regions accordingly to the following formula:

$$x_d = (x_n + x_p) = \sqrt{\frac{2\varepsilon_S}{q}\left(\frac{1}{N_D} + \frac{1}{N_A}\right)}\sqrt{\phi_i + V},$$

where $\phi_i$ is the built-in potential of the pn-junction.

Since in the case analyzed $N_D \gg N_A$, the depletion region will extend mostly in the p-substrate $$x_d \approx x_p = \sqrt{\frac{2\varepsilon_S}{N_A q}} \sqrt{\phi_i + V} = K\sqrt{\phi_i + V},$$

Where, to simplify the following notations, a new parameter K has been defined as:

$$K = \sqrt{\frac{2\varepsilon_S}{N_A q}},$$

At the equilibrium (i.e. for V=0), the depletion width can be expressed as:

$$x_{p0} = \sqrt{\frac{2\varepsilon_S}{N_A q}} \sqrt{\phi_i} = K\sqrt{\phi_i}.$$

Applying a voltage V to the control terminal, the depletion region will increase of the amount x accordingly to the following equation:

$$x_p^2 = (x + x_{p0})^2 = K^2 \phi_i + K^2 V,$$

which can be rearranged as:

$$(x + K\sqrt{\phi_i})^2 = x^2 + 2Kx\sqrt{\phi_i} + K^2\phi_i = K^2\phi_i + K^2 V,$$

The relation between the control voltage and the depletion region extension is therefore:

$$V = \frac{2Kx\sqrt{\phi_i} + x^2}{K^2} = \frac{(2K\sqrt{\phi_i} + x)}{K^2} x.$$

This relation is illustrated in FIG. 2, where the depletion region width as a function of the control voltage for a doping concentration of $5 \times 10^{24}$ m$^{-3}$ of donors and $1 \times 10^{21}$ m$^{-3}$ of acceptors is reported.
The previous relation becomes linear if $x \ll 2K\sqrt{\phi_i}$.
Since, $$x = K\sqrt{\phi_i + V} - K\sqrt{\phi_i},$$

the condition of linearity can be expressed also as:

$$K\sqrt{\phi_i + V} \ll 3K\sqrt{\phi_i},$$

$$V \ll 8\phi_i.$$

More in general, with a control bias point V, the condition for linearity imposes that the voltage variation $\Delta V$ must satisfy the following relations:

$$\Delta x^2 + 2K\Delta x \sqrt{\phi_i + V} = K^2 \Delta V,$$

$$\Delta x \ll 2K\sqrt{\phi_i + V},$$

$$\Delta x = K\sqrt{\phi_i + V + \Delta V} - K\sqrt{\phi_i + V},$$

$$\Delta V \ll 8(\phi_i + V).$$

If the previous condition of linearity is satisfied, the $\Delta x$ increment due to a voltage increment $\Delta V$ can be expressed as:

$$\Delta V = 2\frac{\sqrt{\phi_i + V}}{K} \Delta x.$$

The capacitance C can be expressed (assuming for simplicity $x_L = 0$) as:

$$C = \frac{\varepsilon_{ox}}{d} W * (L - K\sqrt{\phi_i + V + \Delta V}) = C_0(V) + \Delta C.$$

In linear regime, the capacitance variation $\Delta C$ in a bias point V can be expressed as:

$$\Delta C = -\frac{K\varepsilon_{ox} W}{2d\sqrt{\phi_i + V}} \Delta V,$$

whereas the capacitance $C_0(V)$ is given by:

$$C_0(V) = \frac{\varepsilon_{ox}}{d} W * (L - K\sqrt{\phi_i + V}).$$

A variable capacitance with a good linearity over a wide range relative to the control voltage can be then obtained. This is a very important characteristic in several applications, since it allows the use of very simple control circuits.

In order to increase the capacitance range, a second control region can be added as shown in FIG. 3. In this device the capacitance between the C1 terminal 10 and the C2 terminal 15 is varied applying a DC voltage between the two controls 13 and 19 (which are short circuited) and the C2 terminal 18. In this case the total depletion region width is doubled.

The embodiments illustrated above are based on a MOS structure. This makes the capacitance value depending on the voltage $V_{C1C2}$ between the terminal C1 and C2. In order to decrease the capacitance dependence on the voltage $V_{C1C2}$, the control region 2 of FIG. 1 can be made in poly-silicon of the same (or opposite) doping type and similar impurities concentration of the substrate as illustrated in FIG. 4.

The symmetry created in this configuration between the two terminals of the capacitance partially compensates the eventual depletion or enhancement phenomena that can take place on the lower side of the capacitance oxide 22, reducing the capacitance dependence from the $V_{C1C2}$ voltage.

A similar configuration can be applied also to the embodiment of FIG. 3 as illustrated in FIG. 5. In both cases, the control on the capacitance can be further enhanced, adding two n+ (or p+ if the regions 21 or 29 are n-doped) control regions at the sides of region 21 (or 29), which can be used to modulate the depletion of the upper semiconductor plate of the capacitance.

The capacitance value as a function of the control voltage is illustrated in FIG. 6 as obtained from the numerical simulation of the structure of FIG. 5. As it can be seen, both the capacitance and the control voltage can vary in a wide range maintaining a linear relation.

As mentioned above, the capacitance dependence on the voltage $V_{C1C2}$ is due to the carrier enhanced or depletion that can take place at the semiconductor-dielectric interface. When $V_{C1C2}$ decreases under the Flat-band voltage $V_{FB}$ or increases over the inversion threshold voltage $V_T$ the capacitance value becomes almost independent from the control voltage.

The flat-band voltage $V_{FB}$ is given by the difference between the Electron affinity of the two equivalent capacitance plates whereas, the threshold voltage $V_T$ can be expressed as:

$$V_T = V_{FB} + 2|\phi_p| + \frac{1}{C_{ox}}\sqrt{4\varepsilon_S q N_A |\phi_p|}$$

where $C_{ox}$ is the dielectric capacitance, $$\phi_p = \frac{K_B T}{q}\ln(N_A/n_i),$$

$K_B$ is the Boltzmann constant, T is the semiconductor temperature, and $n_i$ is the intrinsic carrier concentration in the substrate.

Considering for example the structure of FIG. 3, when $V_{C1C2}$ increases over the threshold voltage $V_T$, the electron concentration at the semiconductor-dielectric interface increases creating a n+ interface-layer that isolates the capacitance from the p-substrate. In this case the capacitance between the C1 terminal 10 and the C2 terminal 18 is almost independent from the control voltage bias.

Vice-versa, when $V_{C1C2}$ decreases under the flat band voltage $V_{FB}$, the hole concentration at the semiconductor-dielectric interface increases creating a p+ interface-layer which does not deplete much when the control voltage increases. Also in this case, the capacitance between the C1 terminal 10 and the C2 terminal 18 is weakly dependent on the control voltage.

If the voltage $V_{C1C2}$ is kept between $V_{FB}$ and $V_T$ however, the capacitance is only weakly dependent from it. It follows that in order to increase the voltage range where $V_{C1C2}$ can be varied without altering the capacitance value, the following quantity must be increased:

$$V_T - V_{FB} = 2|\phi_p| + \frac{1}{C_{ox}}\sqrt{4\varepsilon_S q N_A |\phi_p|}$$

This can be done in various ways. For example, one method is to use semiconductor materials with high energy gaps, such as Silicon Carbide or Gallium Nitride instead of Silicon.

The range described above can be also shifted in the voltage axis simply by changing the flat-band voltage, and/or adding local charge inside the capacitance dielectric and/or adding a thin heavily doped layer at the semiconductor-dielectric interface. For example, if a thin heavily p-doped layer is added at the lower semiconductor-dielectric interface of the structure shown in FIG. 3, the device can be used with a $V_{C1C2}$ voltage of 4-5V maintaining the control of the control terminals 19 and 13 on the capacitance value. Obviously several other methods can be used to achieve the same result.

In order to eliminate significantly the dependence of the MOS capacitor from the $V_{C1C2}$ voltage and at the same time increase the specific capacitance, the embodiment of FIG. 7 can be utilized. As it can be seen this embodiment is similar to the one shown in FIG. 3, with the exception that a multiplicity of small semiconductor pillars 50 has been formed on the top of the semiconductor substrate 45. Above these semiconductor pillars, the capacitance dielectric 41 has been grown and the C1 terminal 40 has been deposited. The upper portion of these semiconductor pillars 51 has been heavily doped in order to maximize the specific capacitance and make the MOS system independent from the $V_{C1C2}$ voltage.

The operation principle of this embodiment is the same of the one of FIG. 3, with the difference that the capacitance is quantized: increasing the voltage of the control terminals, a portion of semiconductor pillars becomes isolated from the C2 terminal 48, decreasing the capacitance of the device. If the device is not optimized, the capacitance characteristic as a function of the control voltage is therefore stairs like. The more the control voltage increases, the more pillars are isolated creating a sequence of step transactions on the capacitance value.

Optimizing the height, width and doping profile of the different pillars, the dependence of the device capacitance in function of the control voltage can be however linearized. For example lowering the height of the pillars as shown in FIG. 8, the step transactions are smoothed out to the point that a linear control range can be identified as shown in FIG. 9, where the device capacitance as a function of the control voltage obtained from the device simulation is shown.

Another means of linearizing the capacitance variation is to make the device asymmetrical in order to compensate the steps created from the depletion region of the first control terminal 49 in FIG. 7 (or 62 in FIG. 8), with the steps pattern created from the depletion region of the second control terminal 43 in FIG. 7 (or 56 in FIG. 8). Another possibility is to use two control voltages, one for the left control region and another one for the right control region. Obviously other control regions can be added or other solutions can be implemented.

The upper portion of the semiconductor pillars 51 in FIG. 7 (63 in FIG. 8), or the whole pillars, can be realized also using metallic materials, in order to eliminate completely the dependence of the capacitance from the $V_{C1C2}$ voltage. It is important to notice that the semiconductor (or metallic) pillars 51 in FIG. 7 (or 63 in FIG. 8) can have different shapes one from the other and that they can be formed with semiconductor trench process steps.

Different doping profiles can be used to improve the device performance. For example, in FIG. 10 a heavily doped buried region has been added in order to decrease the parasitic resistance associated with the C2 terminal.

All the structures described above can be realized with a standard CMOS process. In some case an extra mask may be necessary to select the substrate implantation and achieve the best device performance. The distance between the n+ implants and the upper capacitance electrode C1 can be obtained by adding two extra spacers to the structure during the fabrication process. In the case of the embodiments of FIGS. 7 and 8, an extra process step is required in order to form the pillars in the silicon substrate (by means of a silicon etching or a deposition process step) at the beginning of the MOS process.

As illustrated in the example of FIG. 11, all the embodiments illustrated above can be realized also in silicon on insulator technology. Furthermore, they can be realized as both discrete and integrated components with minimal changes.

As shown in FIG. 12-17, the present invention can be realized using a vertical configuration. This configuration offers several advantages over the planar structure without requiring major process modifications with respect to a standard CMOS process.

FIG. 12 illustrates a vertical embodiment of the present invention. As it can be seen, in this structure the C2 terminal of the capacitance is formed in a silicon pillar surrounded by the capacitance oxide and the C1 terminal. The control region n+ 93 is formed above the semiconductor pillar and it allows the modulation of the depletion region under it.

The vertical geometry of the device increases drastically the capacitance per unit area without requiring silicon on insulator process technology, which significantly lowers the cost of the device. Another example of vertical embodiment is shown in FIG. 13, where other two n+ regions 98 and 100 have been added to increase the control on the capacitance value.

FIG. 14 depicts the cross-section of a particular embodiment of the invention, where the terminal C1 106 and the capacitance dielectric 115 have been placed above the semiconductor pillar, and the control terminals have been implemented with two metal-oxide electrodes 107 and 114. In this case the control of the capacitance is achieved depleting the semiconductor pillar in the direction perpendicular to its symmetry axis.

FIG. 15 illustrates the semiconductor device resulting from the connection in parallel of multiple structures, each resembling the one described in FIG. 12. As it can be seen the resulting device is composed by an array of semiconductor pillars in order to concentrate the maximum number of modulated capacitors per silicon area.

The C2 region p+ 120 can be also divided in several regions in order to simplify the fabrication process. In this case the final structure is obtained by simply placing, next to each other, several structures like the one illustrated in FIG. 12. A similar composed structure can be obtained using the embodiment of FIG. 13 or 14.

The different pillars composing the embodiment of FIG. 15 can be fabricated with different shapes. The dimensions and the shape of the pillars cross-sections determine the specific capacitance (capacitance per unit area) improvement with respect to the planar structures of FIGS. 1, 3, 4 and 5. FIG. 16 and FIG. 17 depict two possible layout configurations for the vertical structures described above. Obviously, a similar layout can be used for the embodiments of FIGS. 7 and 8.

Aside from the parallel plate configuration of FIG. 16, the present invention can be realized with many different pillar shapes. Each semiconductor pillar of the device can have three, four, six or more walls (the cross-section of the semiconductor pillars can have a triangular, trapezoidal, rectangular, square, octagonal, hexagonal, circular, or oval shape). As illustrated in FIG. 17, combining for example triangular pillars, a significant improvement of the specific capacitance can be achieved. The silicon area between the pillars is fully utilized, and the number of vertical capacitors plates per silicon area is maximized.

Assuming that the semiconductor pillars constituting the device have a triangular cross section with edges wide 2A=2L each, where L is the minimum feature size of the technology available, a single triangular semiconductor pillar will use $$\text{Area triangle} = (2L)*[2L*\sin(60\ \text{deg})]/2 = \sqrt{3}*L^2\ \text{silicon area}$$

Considering a device with 10 semiconductor pillars as illustrate in FIG. 17, and taking into account the lateral overhead necessary for the source terminal, the required silicon area is about $10*\sqrt{3}/2*L^2 + 10*L^2 \approx 20*L^2$, which is about the silicon area occupied by a single planar MOS capacitor square shaped whose width is 4*L.

Since each semiconductor pillar allows an improvement of the capacitance by a factor of 3 with respect to a planar structure (assuming that each pillar is high 4 L), a pillar MOS with 10 triangular pillars can have a specific capacitance 7 times higher than a simple planar MOS capacitor.

The embodiment of FIG. 17 allows an improvement of the performance of a single device by a factor 7 or more (this factor is strongly related to the pillars height). Similar considerations can be done for other pillar shapes such as trapezoidal, rectangular, square, octagonal, hexagonal, circular, oval and etc.

Another interesting embodiment of the present invention is illustrated in FIG. 18. This embodiment has the same structure of FIG. 3, with the difference that the capacitance dielectric 124 and the substrate surface in contact with it, are not planar but are shaped with a periodic pattern (in the direction perpendicular to the straight line that connects the two pn-junctions) in order to achieve higher specific capacitance. The capacitance surface has a periodic pattern in the direction parallel to the depletion region variation, such that a characteristic pattern which repeats itself in regular intervals can be identified.

In FIG. 18, the capacitance terminal 146 and the capacitance oxide 151 are purposely separated from the substrate 148 in order to better show the substrate surface. The control terminals can be shaped in a conventional way as depicted in FIG. 18, or with the same shape of the capacitor surface.

Different possible shapes for the capacitor surface (such as triangular, trapezoidal, square, sinusoidal, and trench shape) are possible. The dimensions and the shape of the periodic pattern determine the saving of silicon area with respect to the "planar" structures of FIGS. 1, 3, 4 and 5. In the case of a triangular pattern, such as the one illustrated in FIG. 19, the saving of area is given by the expression:

$$\text{Area saving} = 1 - (\text{Planar Equivalent Area}/\text{Total Channel Area}) = 1 - \cos\theta$$

where θ is the angle as indicated in FIG. 19.

It follows that, if for example θ=75 deg, the area saving becomes about 75%. This means that a capacitor with the total effective capacitance area of $A=10\times10\ \mu m^2$ can be built using only ¼ of the silicon area utilized for a more conventional structure. Aside the one of FIG. 19, many other shapes are possible for the patterned period of the capacitor surface, such as trapezoidal, rectangular, sinusoidal, trench and others.

All the previously described patterns can be realized with rounded corners in order to improve the device reliability. Similar considerations apply also to the vertical configurations of the present invention, where the corner of the semiconductor pillars can be rounded to improve the device reliability.

For all the device structures described above, the pn-junctions used to modulate the area of the equivalent capacitance plates in the different embodiments, can be replaced with schottky contacts by simply substituting the control regions (such as, for example, region 5 in FIG. 1, or region 14 and 16 in FIG. 2 or region 93 in FIG. 12) with metal regions (with an opportune work function). Similar observations can be done for the metal-insulator (or poly-silicon-insulator) electrodes of FIG. 14, which can be replaced by pn-junctions or schottky contacts.

Both the vertical and the "wrinkled" surface embodiments described above can be obtained with a simple extra process step with respect to the planar structures of FIG. 1, FIG. 3, FIG. 4 and FIG. 5. The substrate surface can be shaped as desired by means of a simple silicon etching step at the beginning of the MOS process. The other process steps (implantations, oxide thermal growth, and poly-silicon deposition) will remain unchanged with respect to a conventional CMOS process. This feature makes also these embodiments very cost attractive.

Another interesting embodiment of the present invention is illustrated in FIG. 20. In this case a second metal (or poly silicon)—oxide electrode has been added above the source/drain region of a MOSFET structure. The substrate, even if not shown in FIG. 20, is connected to a supply voltage through a p+ implantation as in conventional MOS transistors. In this configuration the capacitance can reach higher values. Furthermore, in this embodiment, the capacitance between the C1 terminal 157 and the C2 terminal 163 is almost completely independent from the voltage $V_{C1C2}$. However, differently from the previous embodiments, the control voltage range is quite small.

In order to overcome this problem, several structures as the one illustrated in FIG. 20 can be connected in parallel in order to obtain a digitally variable capacitor. Using a digital control system for the different control terminals of the resulting array structure, it is possible to obtain a very efficient variable capacitor with a wide range of capacitance values. The total capacitance of the system is directly proportional to the number of FET turned on in the array.

The structure shown in FIG. 20 can be realized also with a wrinkled configuration resembling the one illustrated in FIG. 18. The simplicity of the device and its extremely high compatibility with a standard CMOS process, make the present invention a very attractive solution.

Another example of embodiment of the present invention is reported in FIG. 21, where an array of vertical MOS structures with an extra metal-oxide electrode above the source/drain region is illustrated. The n+ regions 167 are short circuited all together in the (not showed) third dimension of the structure to the C2 terminal. As it can be seen the resulting structure is very compact and allows many degrees of freedom in the design.

In the particular embodiment illustrated, each control terminal modulates only one channel however, many other variants such as gate all around configurations are possible. If desired, each control terminal can modulates two parallel channels, and/or the n+ regions 167 can be replaced with a single n+ region crossing the bases of all semiconductor pillars.

For all the device structures described above, the dual version can be obtained by simply substituting the n-doped implants with p-type ones and vice-versa. Furthermore, many other configurations can be obtained mixing the different embodiments and their variants.

As is clear to those skilled in the art, the basic system of the present invention can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 1

Figure 1:
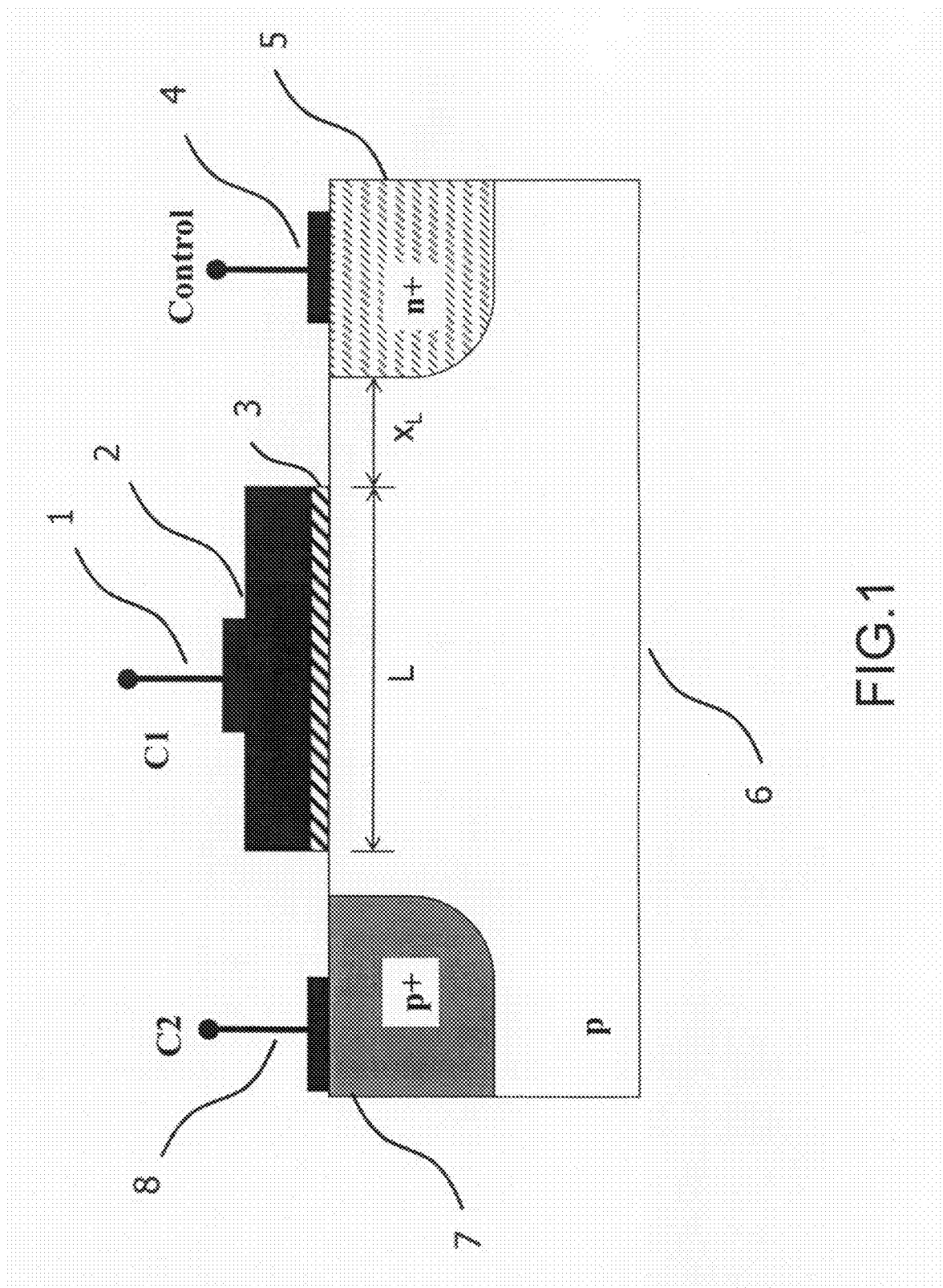
FIG. 1 shows a cross section view of a semiconductor variable capacitor according to a first embodiment of the invention with a single control terminal.

FIG. 1 is showing the first embodiment of the invention. The n+-type region 5 defines the control terminal of the device whereas the region 2 and the p+ region 7 are the two terminals of the capacitor. The regions 3 corresponds to the capacitor dielectric layer, and region 6 is the p-type substrate of the device. $x_L$ is the distance between the capacitance plate 2 and the n+ control region 5, whereas L is the length of the upper capacitance plate 2. The lower capacitance plate is constituted by the substrate 6, and is connected to the C2 terminal 8 through the p+ region 7. The C1 electrode (or terminal) 2 may be built in poly-silicon or metal.

As it can be seen, the structure is very simple and the DC control voltage, which is applied between the control terminal 4 and the C2 terminal 8, never alters the DC voltage between the two main electrodes of the MOS capacitor.

The plates distance $x_L$ can be used to regulate the capacitance values range. The n+ region should never overlap with the capacitance electrode 2 in order to avoid that the DC control voltage influences also the DC voltage across the MOS structure distorting the device behavior. Furthermore, the length L of the device should be less than the maximum depletion region of the substrate. This last condition limits the value of L.

B FIG. 2

Figure 2:
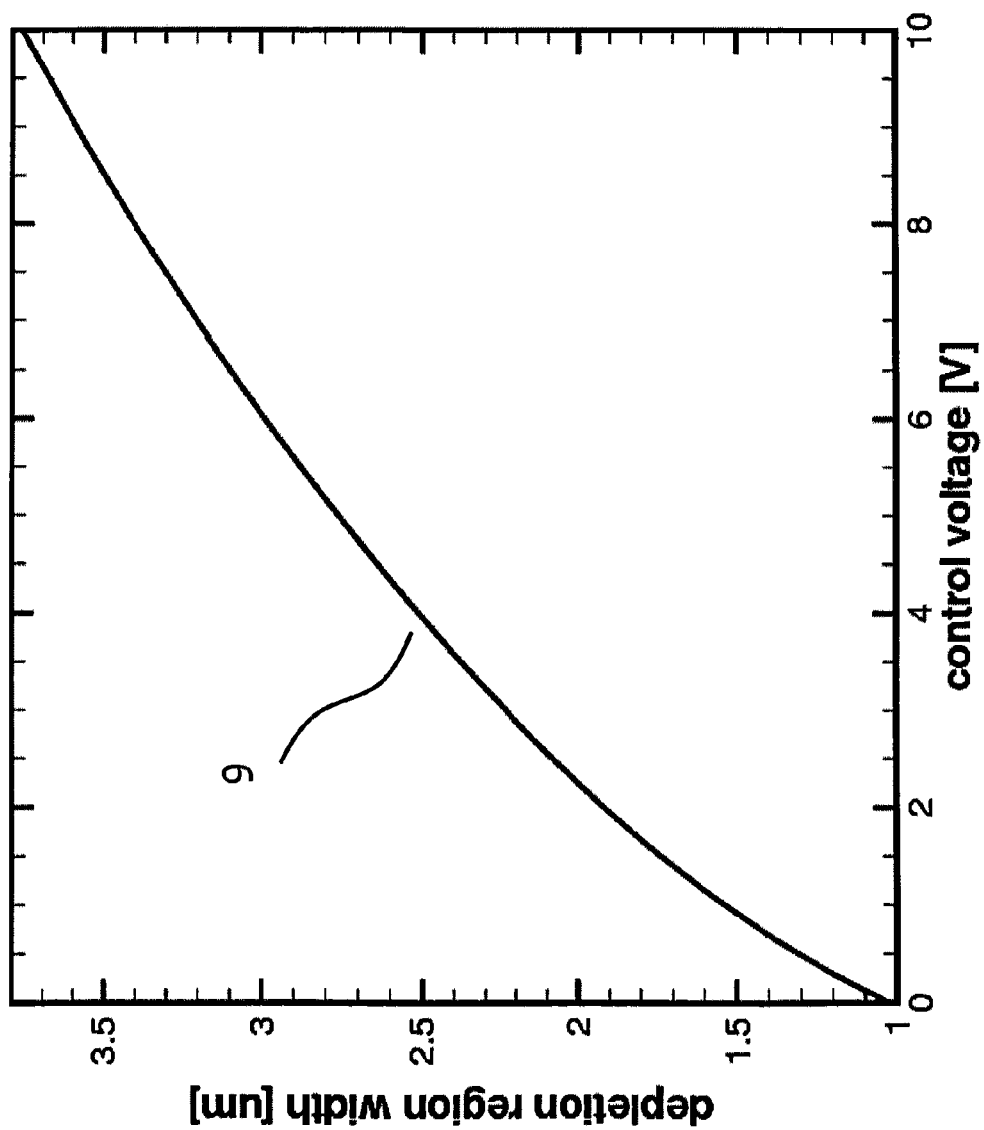
FIG. 2 shows the depletion region width in the p side of a pn-junction as a function of the reversed bias voltage.

FIG. 2 shows the depletion width in the p-substrate of the device as a function of the control voltage applied to the n+ region. The substrate has a p-doping concentration of $10^{21}$ m$^{-3}$, whereas the n+ control region is doped with $5\times10^{24}$ m$^{-3}$ impurities. As it can be seen, the depletion region width for the single control device of FIG. 1 is limited to about 4 μm for a drive voltage of 10V.

C FIG. 3

Figure 3:
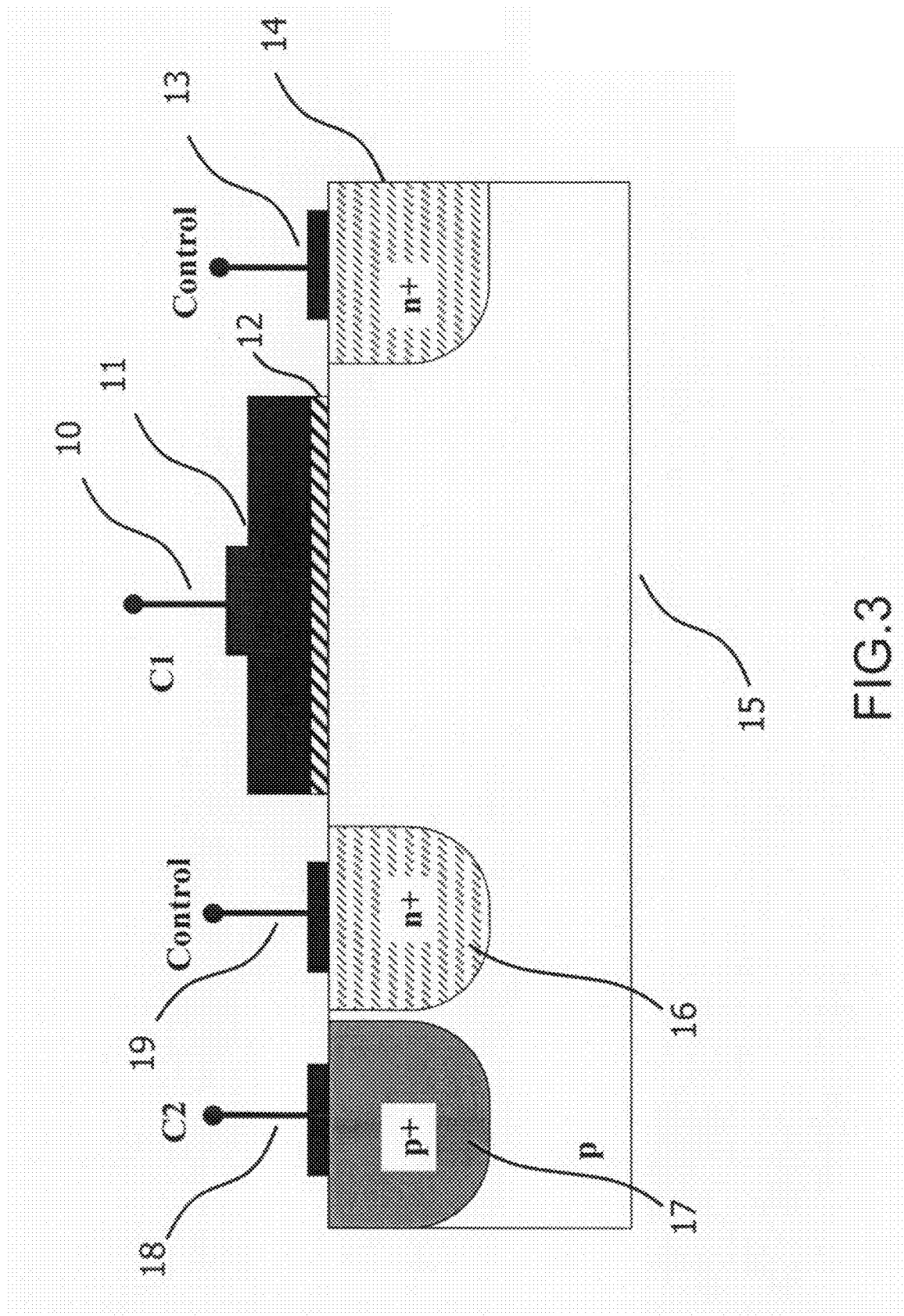
FIG. 3 shows a cross section view of a semiconductor variable capacitor according to a further embodiment of the invention, where a second control region has been added.

In order to decrease this limitation, a second n+ control region can be added to the structure as illustrated in FIG. 3. In this case the length L of the capacitor can be doubled. Other electrodes can be added in the third dimension (not shown).

D FIG. 4

Figure 4:
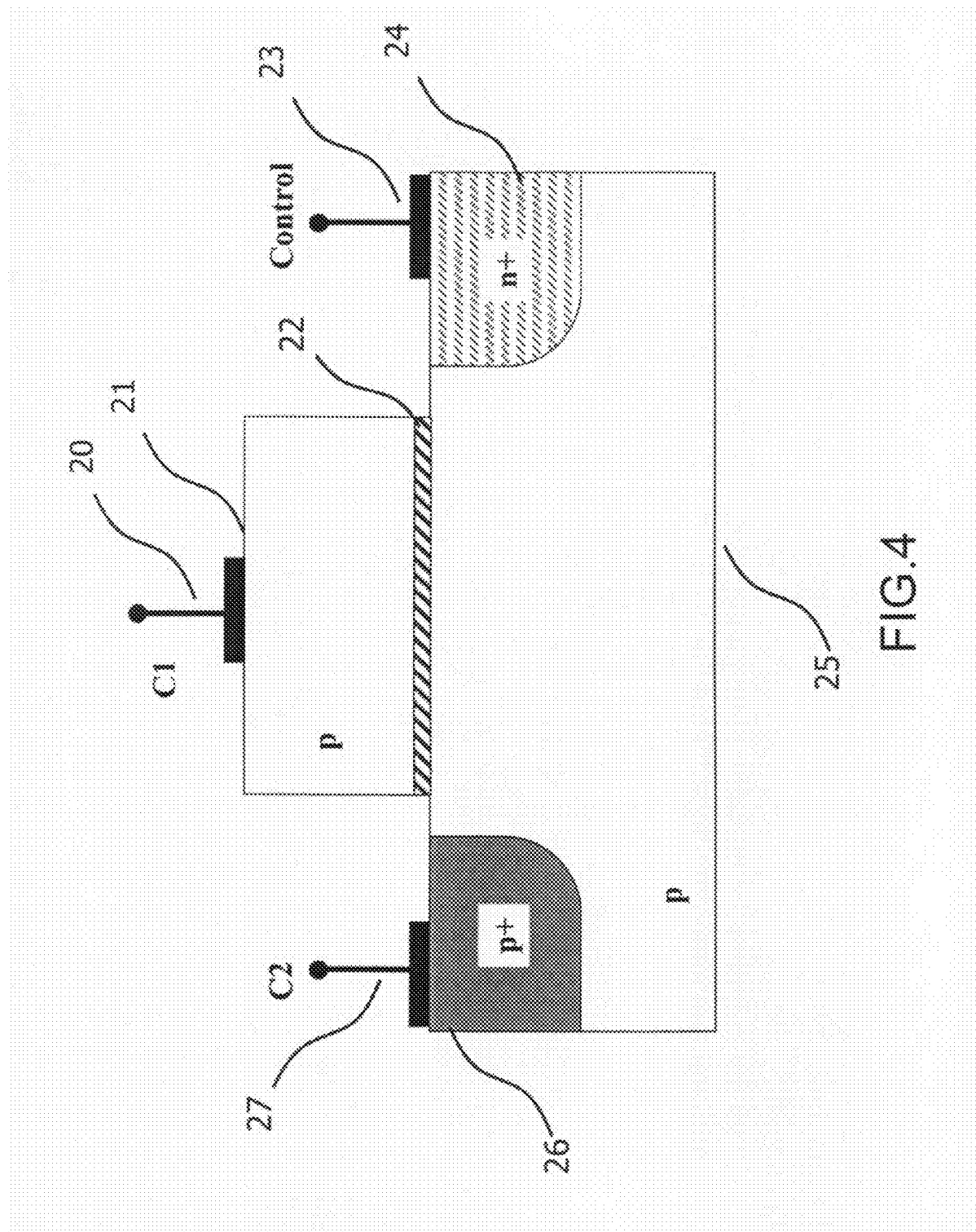
FIG. 4 shows a cross section view of a semiconductor variable capacitor according to a further embodiment of the invention, where the upper capacitance plate has been doped with the same doping concentration of the substrate.

FIG. 4 is depicting the cross-section view of a semiconductor variable capacitor according to a further embodiment of the invention. This structure is similar to the one shown in FIG. 1, with the exception that the capacitor plate 21 is made of p-doped (or n-doped) semiconductor in order to create a symmetry between the two plates of the capacitor and compensate the depletion or enhancement phenomena that can take place under the dielectric surface. This structure allows therefore the improvement of the device control at different $V_{C1C2}$ voltages.

E FIG. 5

Figure 5:
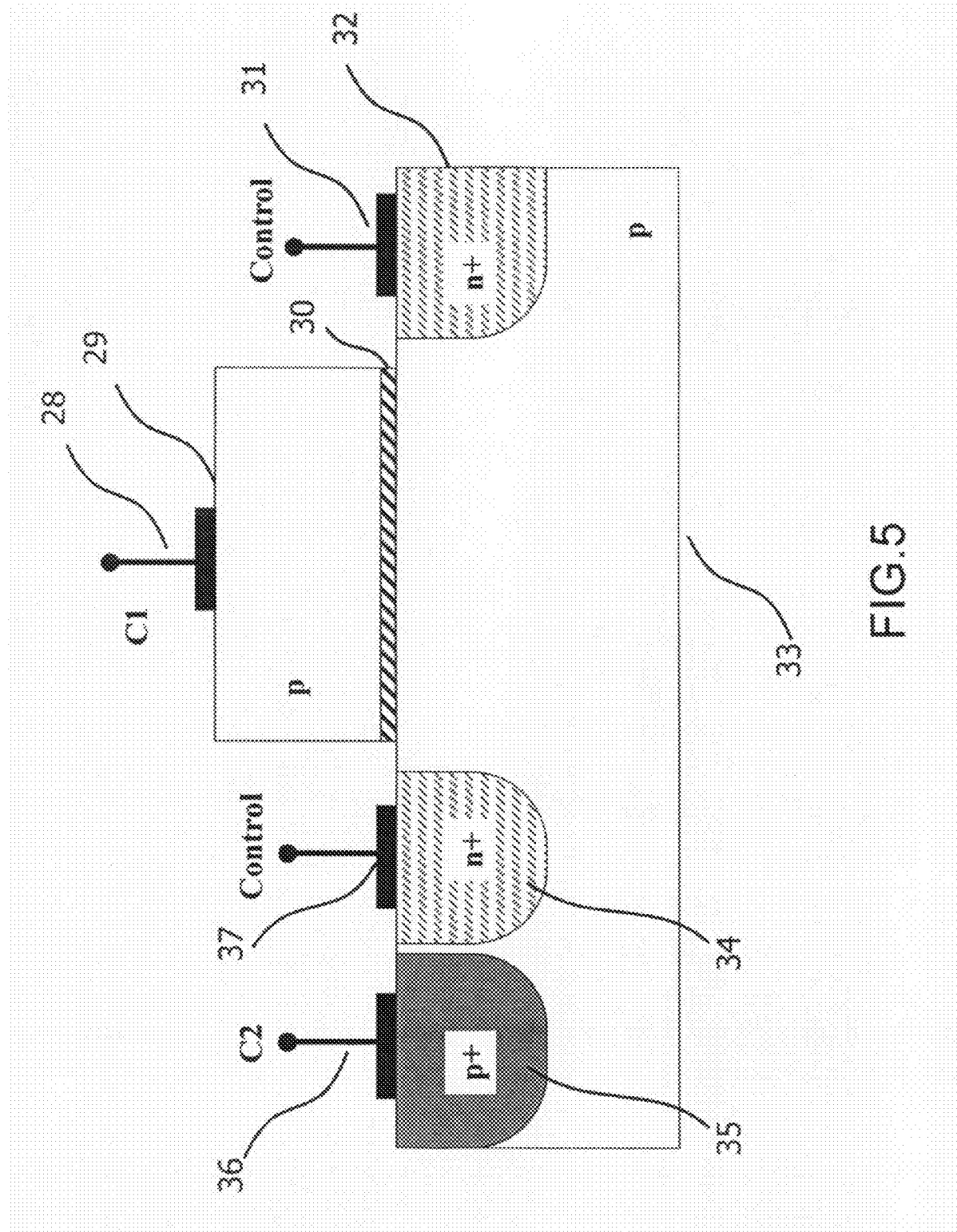
FIG. 5 shows a cross section view of a semiconductor variable capacitor according to a further embodiment of the invention, where a second terminal region has been added and the upper capacitance plate has been doped with the same doping concentration of the substrate.

FIG. 5 is depicting the cross-section view of a semiconductor variable capacitor according to a further embodiment of the invention. This structure is similar to the one shown in FIG. 4, with the difference that a second control region 34 has been added to the structure.

In both embodiments of FIG. 4 and FIG. 5, one or more extra control regions n+ (or p+ depending on the doping of the upper semiconductor plate) can be added in the layer 21 and 29 in order to improve the control of the capacitance value in the case in which the $V_{C1C2}$ voltage creates an accumulation or depletion of carriers at the dielectric interfaces.

As mentioned above, the capacitance dependence on the voltage $V_{C1C2}$ is due to the carrier enhancement or depletion that can take place at the semiconductor-dielectric interface. When $V_{C1C2}$ decreases under the Flat-band voltage $V_{FB}$ or increases over the inversion threshold voltage $V_T$ the capacitance value becomes almost independent from the control voltage.

The flat-band voltage $V_{FB}$ is given by the difference between the Electron affinity of the two equivalent capacitance plates whereas, the threshold voltage $V_T$ can be expressed as:

$$V_T = V_{FB} + 2|\phi_p| + \frac{1}{C_{ox}}\sqrt{4\varepsilon_S q N_A |\phi_p|}.$$

where $C_{ox}$ is the dielectric capacitance, $$\phi_p = \frac{K_B T}{q}\ln(N_A/n_i),$$

$K_B$ is the Boltzmann constant, T is the semiconductor temperature, and $n_i$ is the intrinsic carrier concentration in the substrate.

Considering for example the structure of FIG. 3, when $V_{C1C2}$ increases over the threshold voltage $V_T$, the electron concentration at the semiconductor-dielectric interface increases creating a n+ interface-layer that isolates the capacitance from the p-substrate. In this case the capacitance between the C1 terminal 10 and the C2 terminal 18 is almost independent from the control voltage.

Vice-versa, when $V_{C1C2}$ decreases under the flat band voltage $V_{FB}$, the hole concentration at the semiconductor-dielectric interface increases creating a p+ interface-layer which does not deplete much when the control voltage increases. Also in this case, the capacitance between the C1 terminal 10 and the C2 terminal 18 is weakly dependent on the control voltage.

If the voltage $V_{C1C2}$ is kept between $V_{FB}$ and $V_T$ however, the capacitance is only weakly dependent from it. It follows that in order to increase the voltage range where $V_{C1C2}$ can be varied without altering the capacitance value, the following quantity must be increased:

$$V_T - V_{FB} = 2|\phi_p| + \frac{1}{C_{ox}}\sqrt{4\varepsilon_S q N_A |\phi_p|}$$

This can be done in different ways. For example, one method is to use semiconductor materials with high energy gaps, such as Silicon Carbide or Gallium Nitride instead of Silicon.

The range described above can be also shifted in the voltage axis by simply changing the flat-band voltage, and/or adding local charge inside the capacitance dielectric and/or adding a thin heavily doped layer at the semiconductor-dielectric interface. For example, if a thin heavily p-doped layer is added at the lower semiconductor-dielectric interface of the structure shown in FIG. 3, the device can be used with a $V_{C1C2}$ voltage of 4-5V maintaining the control of the control terminals 19 and 13 on the capacitance value. Several other methods can be used to achieve the same result.

F FIG. 6

Figure 6:
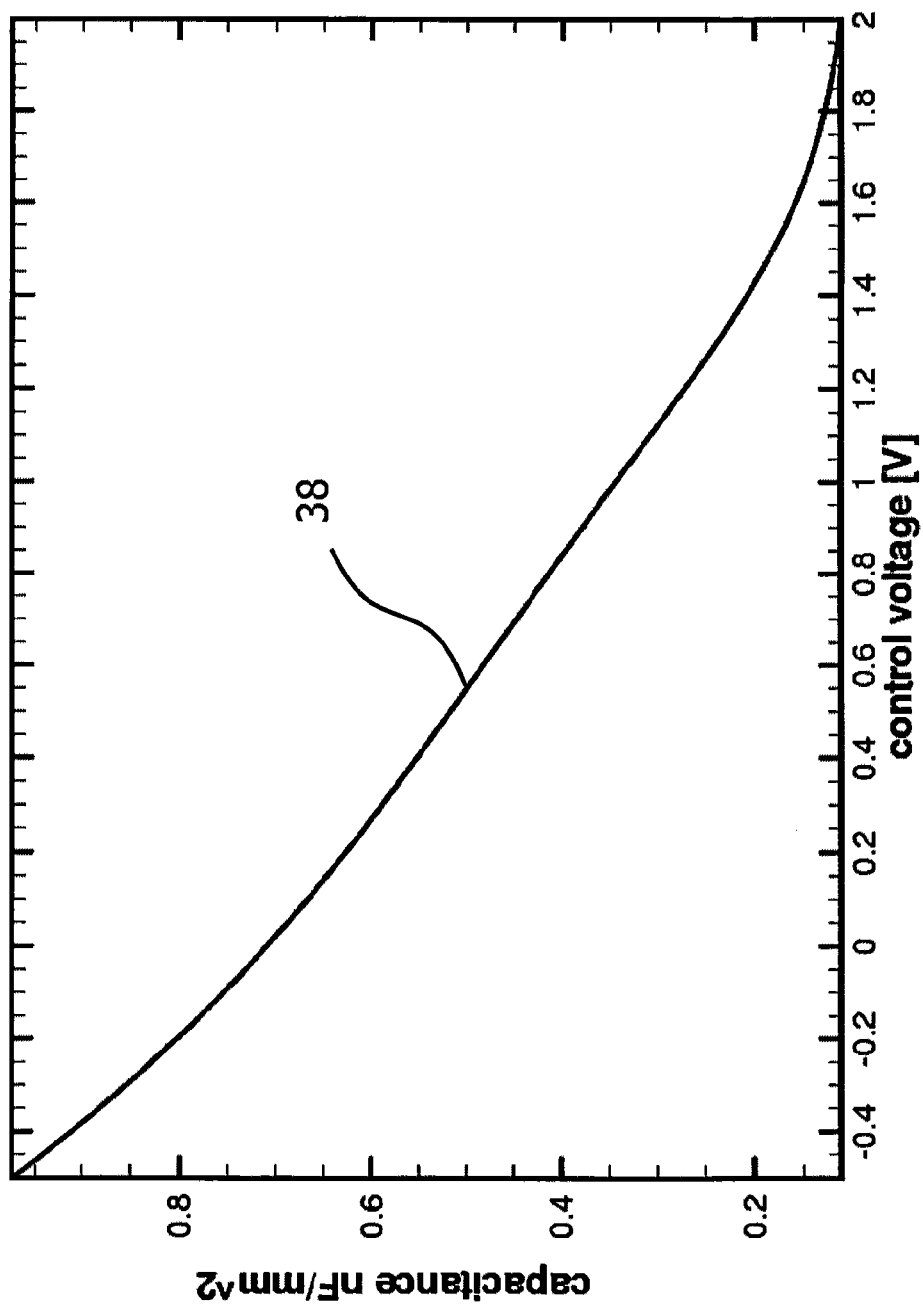
FIG. 6 shows the capacitance value as a function of the control voltage as obtained from the numerical simulation of the further embodiment of the invention as illustrated in FIG. 5.

FIG. 6 illustrates the capacitance value as a function of the control voltage as obtained from the numerical simulation of the embodiment illustrated in FIG. 5. The control regions are doped with $5\times10^{24}$ m$^{-3}$ n-type impurities, whereas the p-substrate is p-doped with $10^{22}$ m$^{-3}$ impurities. As it can be seen, the capacitance value varies by a factor of 8 in a range of 2V, maintaining a linear behavior.

G FIG. 7

Figure 7:
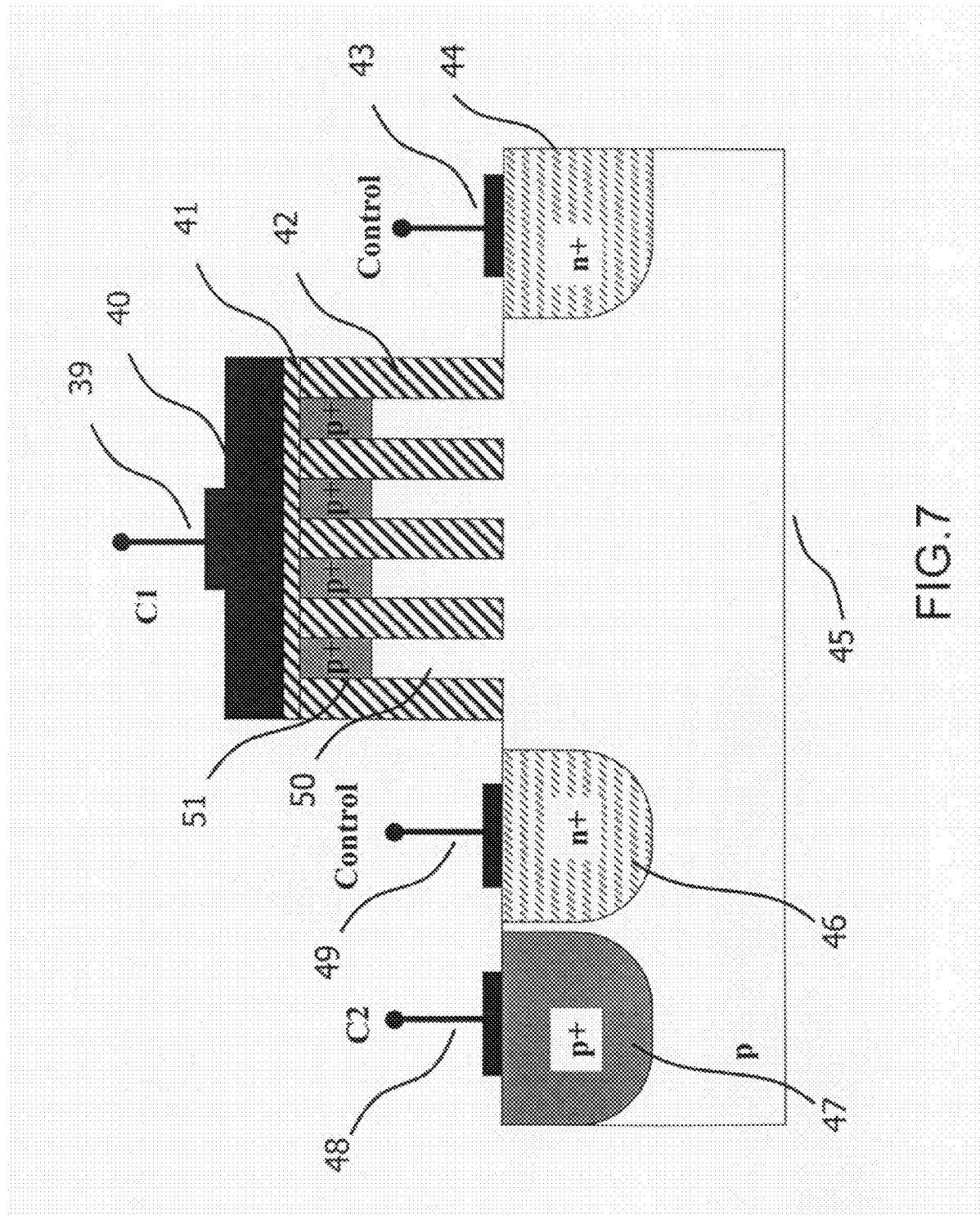
FIG. 7 shows a cross section view of a semiconductor variable capacitor according to the preferred embodiment of the invention, where a multiplicity of pillars has been used as lower equivalent capacitance plate.

In order to reduce significantly the dependence of the MOS capacitor from the $V_{C1C2}$ voltage, and at the same time increase the specific capacitance, the embodiment of FIG. 7 can be utilized. This embodiment, which represents the preferred embodiment of the present invention, is similar to the one shown in FIG. 3, with the exception that a multiplicity of small semiconductor pillars 50 has been formed above the semiconductor substrate 45. Above these semiconductor pillars, the capacitance dielectric 41 has been grown and the C1 terminal 40 has been deposited. The upper portion of these semiconductor pillars 51 has been heavily doped in order to maximize the specific capacitance and obtain a MOS system independent from the $V_{C1C2}$ voltage.

The operation principle of this embodiment is the same of the one of FIG. 3, with the difference that the capacitance is quantized: increasing the voltage of the control terminals, a portion of semiconductor pillars becomes isolated from the C2 terminal 48, decreasing the capacitance of the device. If the device is not optimized, the capacitance characteristic, as a function of the control voltage, is stairs like. The more the control voltage increases and the more pillars are isolated creating a sequence of step transactions on the capacitance value.

H FIG. 8

Optimizing the height, width and doping profile of the different pillars, the dependence of the device capacitance in function of the control voltage can be however linearized. For example lowering the height of the pillars as shown in FIG. 8, the step transactions are smoothed out to the point that a linear control range can be identified.

I FIG. 9

Figure 9:
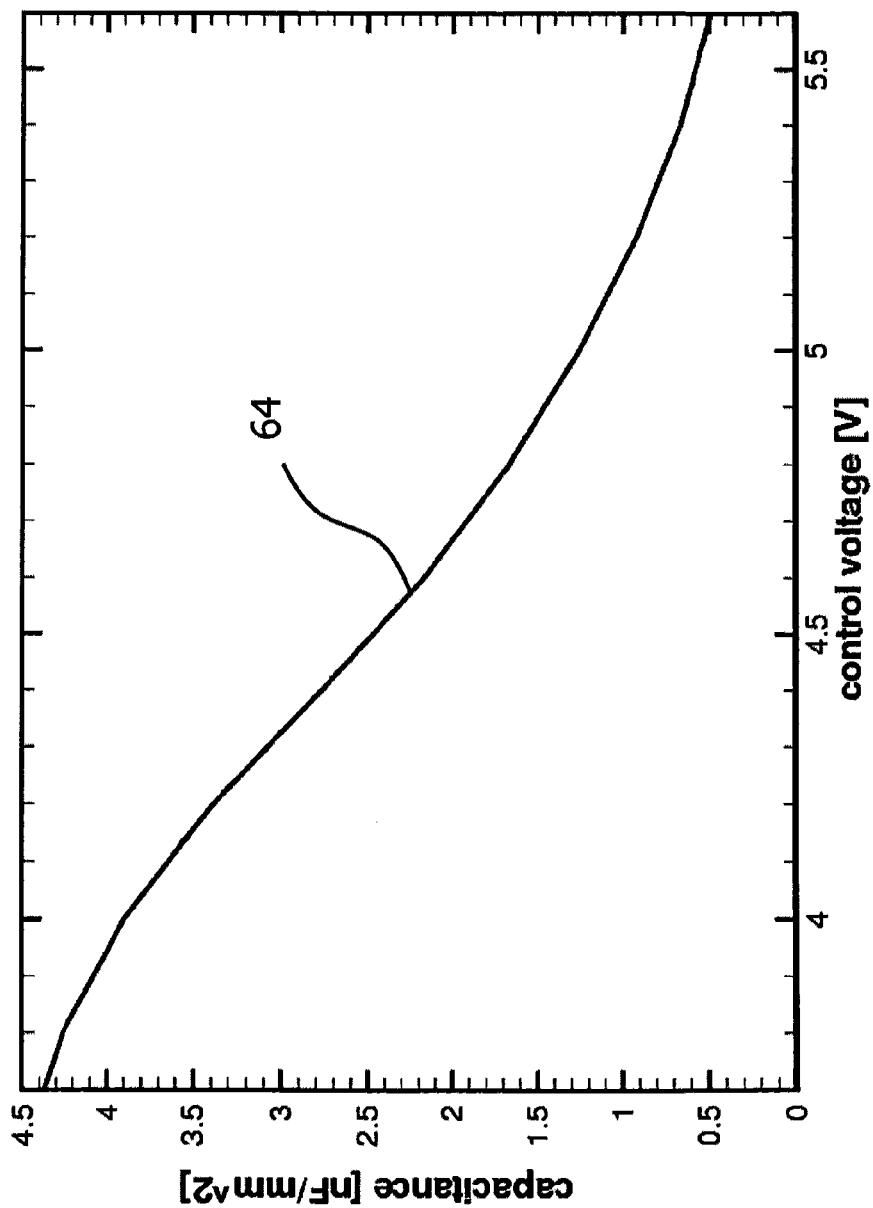
FIG. 9 shows the capacitance value as a function of the control voltage as obtained from the numerical simulation of the further embodiment of the invention as illustrated in FIG. 7.

This feature is shown in FIG. 9, where the device capacitance as a function of the control voltage obtained from the device simulation is shown. The control regions are doped with $5 \times 10^{24}$ m$^{-3}$ n-type impurities, whereas the p-substrate is p-doped with $10^{21}$ m$^{-3}$ impurities. The semiconductor pillars are doped with $10^{26}$ m$^3$ p-type impurities. As it can be seen, the capacitance value varies by a factor greater than 20 in a range of 2V, maintaining a linear behavior.

Figure 8:
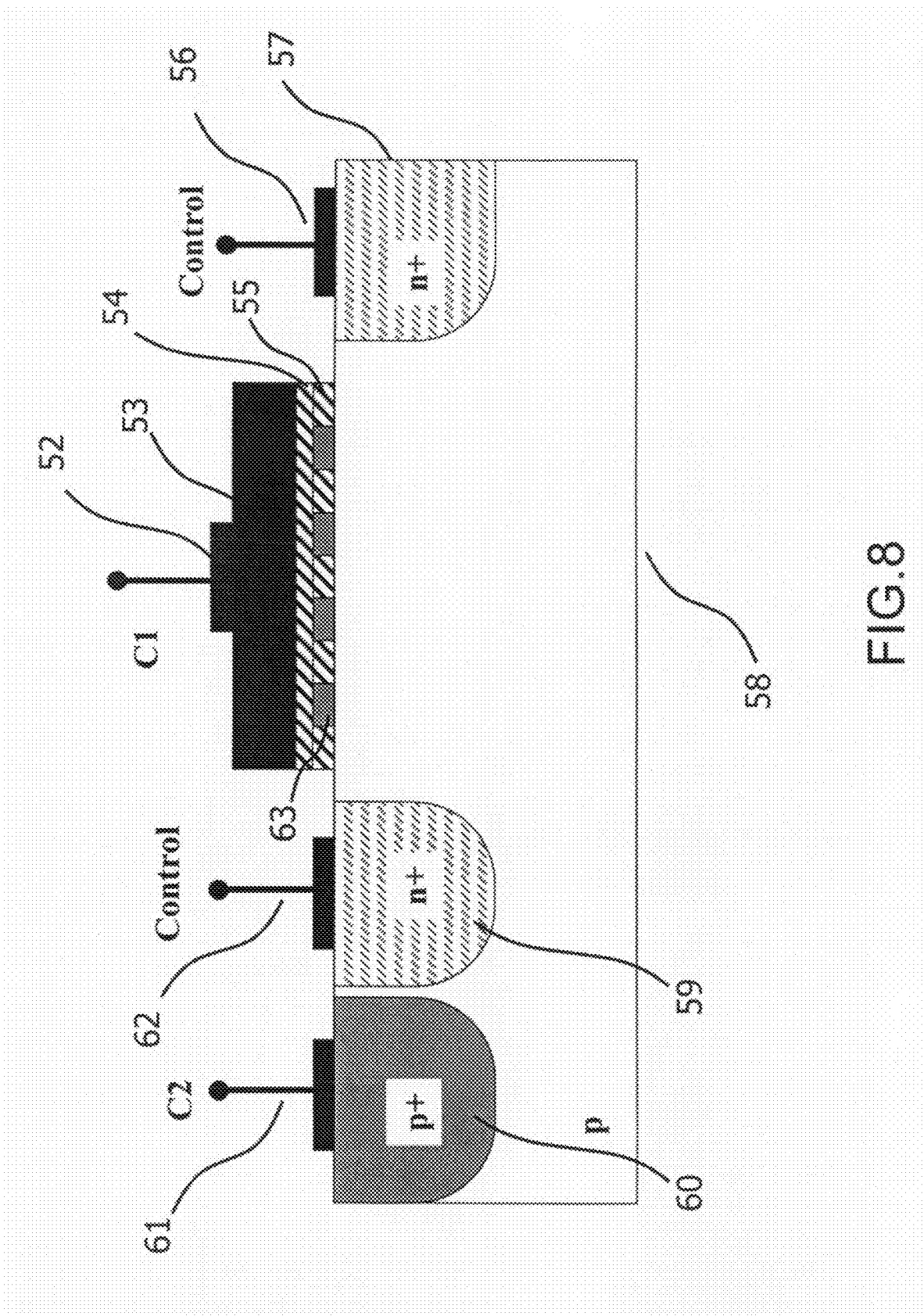
FIG. 8 shows a cross section view of a semiconductor variable capacitor according to a further embodiment of the invention.

Another means of linearizing the capacitance dependence from the control voltage, is to make the device asymmetrical in order to compensate the steps created from the depletion region of the first control terminal 49 in FIG. 7 (or 62 in FIG. 8), with the steps pattern created from the depletion region of the second control terminal 43 in FIG. 7 (or 56 in FIG. 8). Another possibility is to use two control voltages, one for the left control region and another one for the right control region. Obviously other control regions can be added or other solutions can be implemented.

The upper portion of the semiconductor pillars 51 in FIG. 7 (63 in FIG. 8), or the whole pillars, can be realized also using metallic materials, in order to eliminate completely the dependence of the capacitance from the $V_{C1C2}$ voltage.

J FIG. 10

Figure 10:
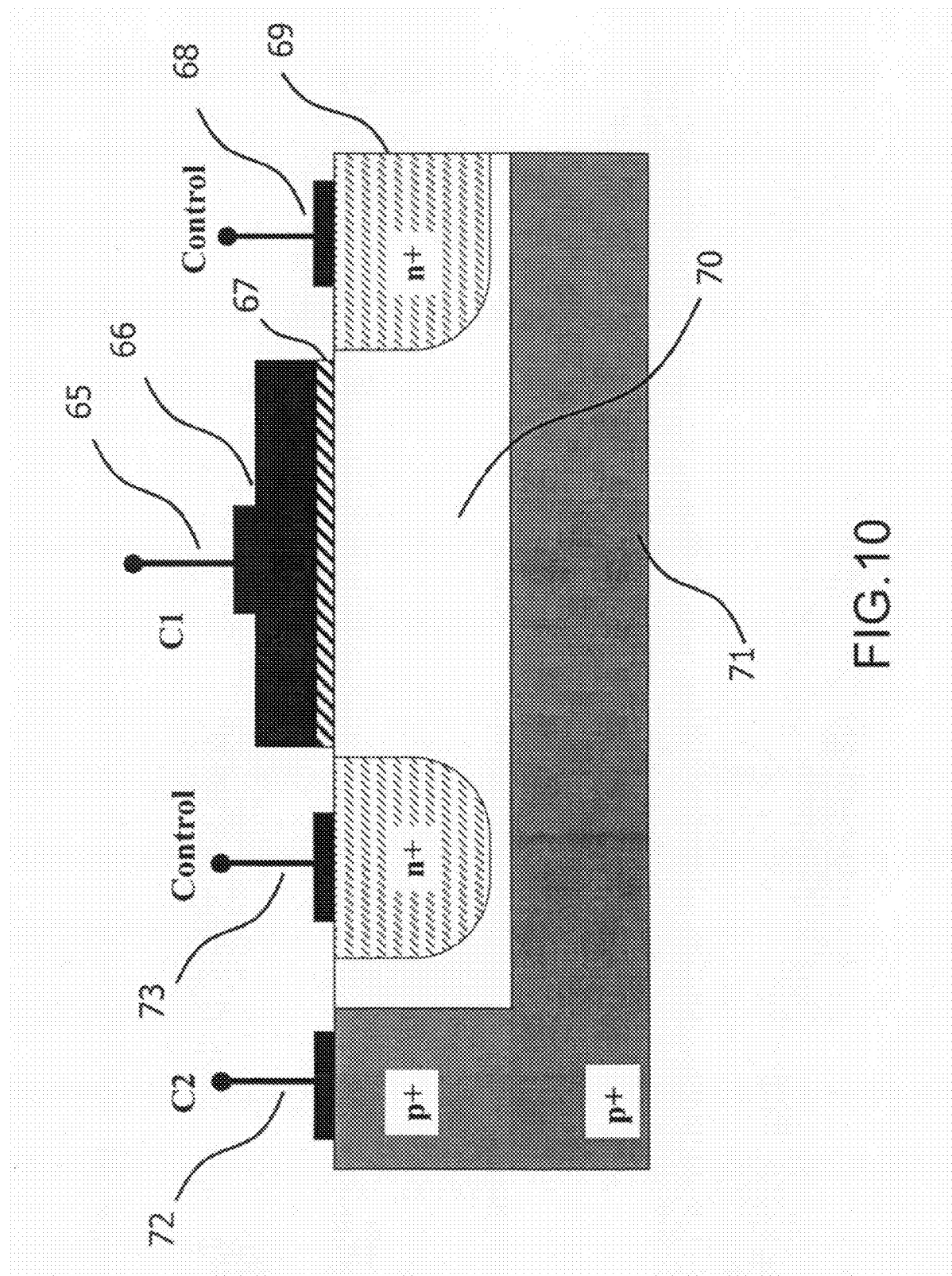
FIG. 10 shows a cross section view of a semiconductor variable capacitor according to a further embodiment of the invention, where the doping profile in the device substrate has been optimized to reduce the parasitic resistance associated with the C2 contact.

In FIG. 10 an heavily p-doped buried region 71 has been added to the structure with double control region of FIG. 3 in order to decrease the parasitic resistance associated to the C2 terminal of the capacitance. Many other doping profiles are possible in order to achieve the same or similar results.

All the structures described above can be realized with a standard CMOS process. In some case an extra mask may be necessary to select the substrate implantation and achieve the best device performance. The distance between the n+ implants and the upper capacitance electrode C1 can be obtained by adding two extra spacers to the structure during the fabrication process. In the case of the embodiments of FIGS. 7 and 8, an extra process step is required in order to form the pillars in the silicon substrate (by means of a silicon etching or a deposition process step) at the beginning of the MOS process.

K FIG. 11

Figure 11:
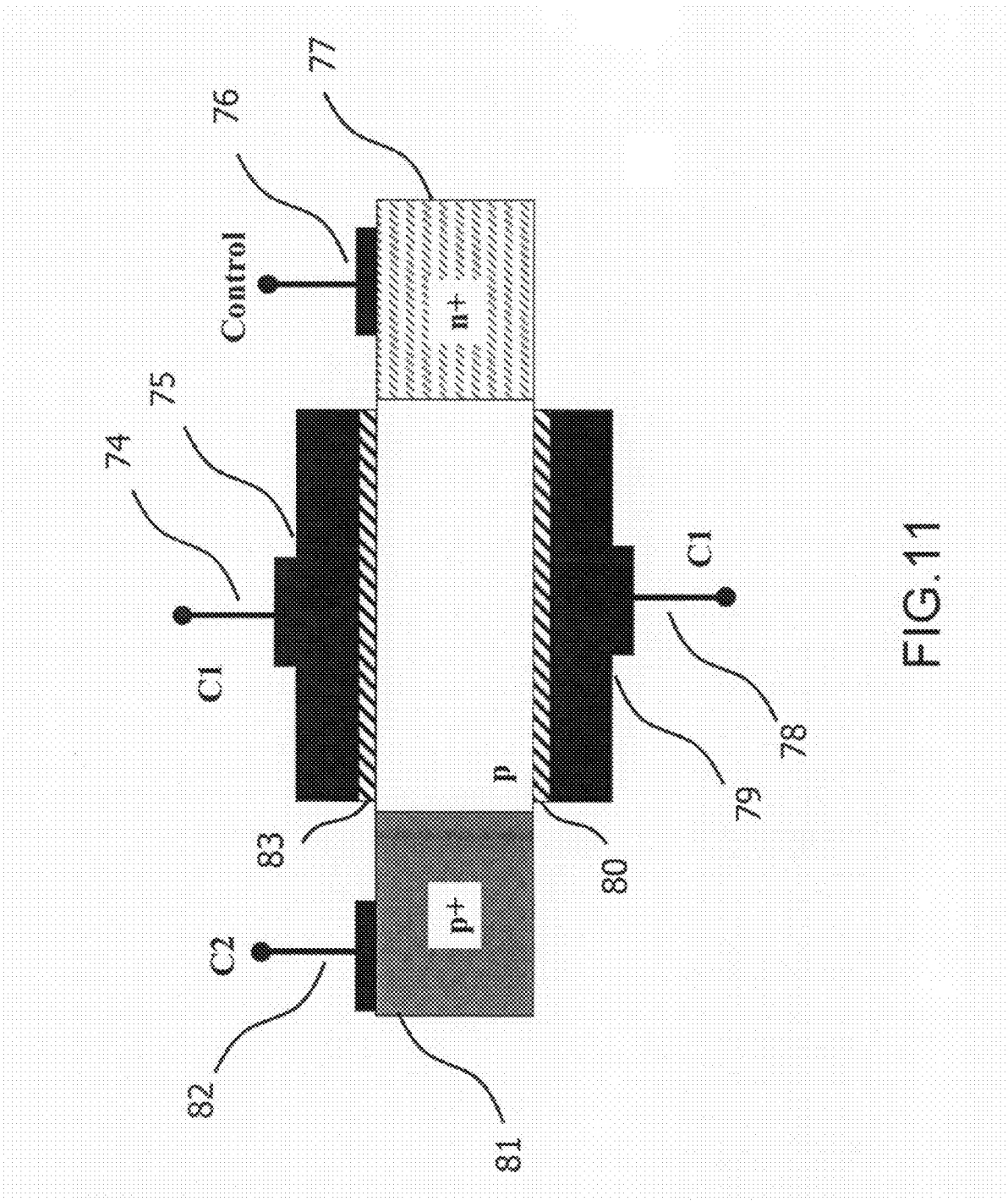
FIG. 11 shows a cross section view of a semiconductor variable capacitor according to a further embodiment of the invention, realized in silicon on insulator technology.

FIG. 11 is depicting the cross-section view of a semiconductor variable capacitor according to a further embodiment of the invention. This structure is built in silicon on insulator technology and has two capacitance terminals C1 74 and 78 short circuited together, in order to double the capacitance per unit area. As well known to anyone skilled in the art, a similar configuration can be used for all the embodiment of the present invention.

L FIG. 12

Figure 12:
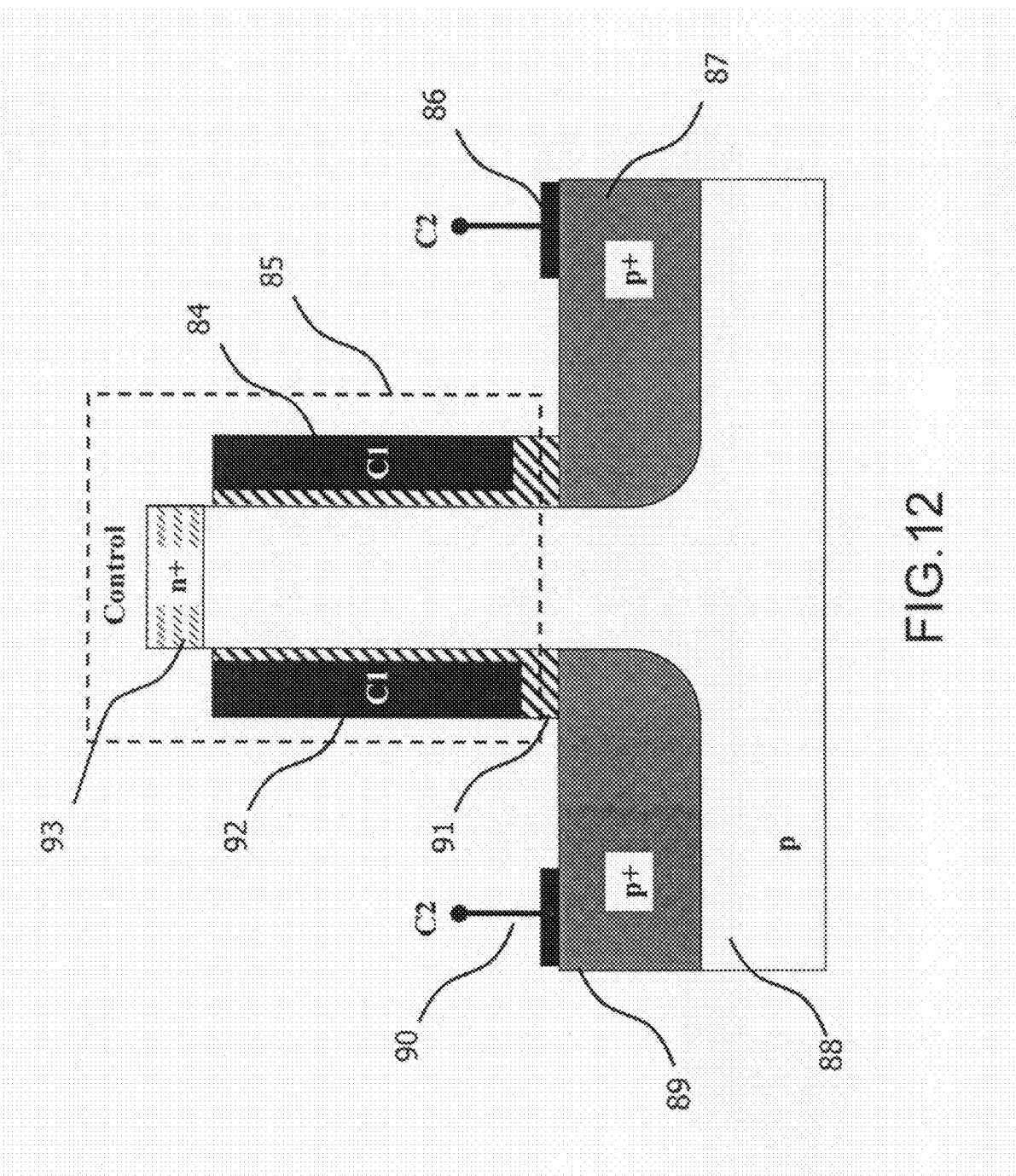
FIG. 12 shows a cross section view of a semiconductor variable capacitor with a single control terminal according to a further embodiment of the invention, built in vertical configuration.

The present invention can be fabricated also using a vertical configuration as illustrated in FIG. 12. This device has only one control region n+ and behaves similarly to the structure of FIG. 1, with the difference that in this case the capacitance per unit area is much higher. This structure is composed by a semiconductor pillar 85 surrounded by a dielectric layer 91 and the capacitance terminal C1. As known to anyone skilled in the art, many other doping profiles are possible for the substrate, for example regions 89 and 87 can be replaced by a single p+ region extending also under the semiconductor pillar.

M FIG. 13

Figure 13:
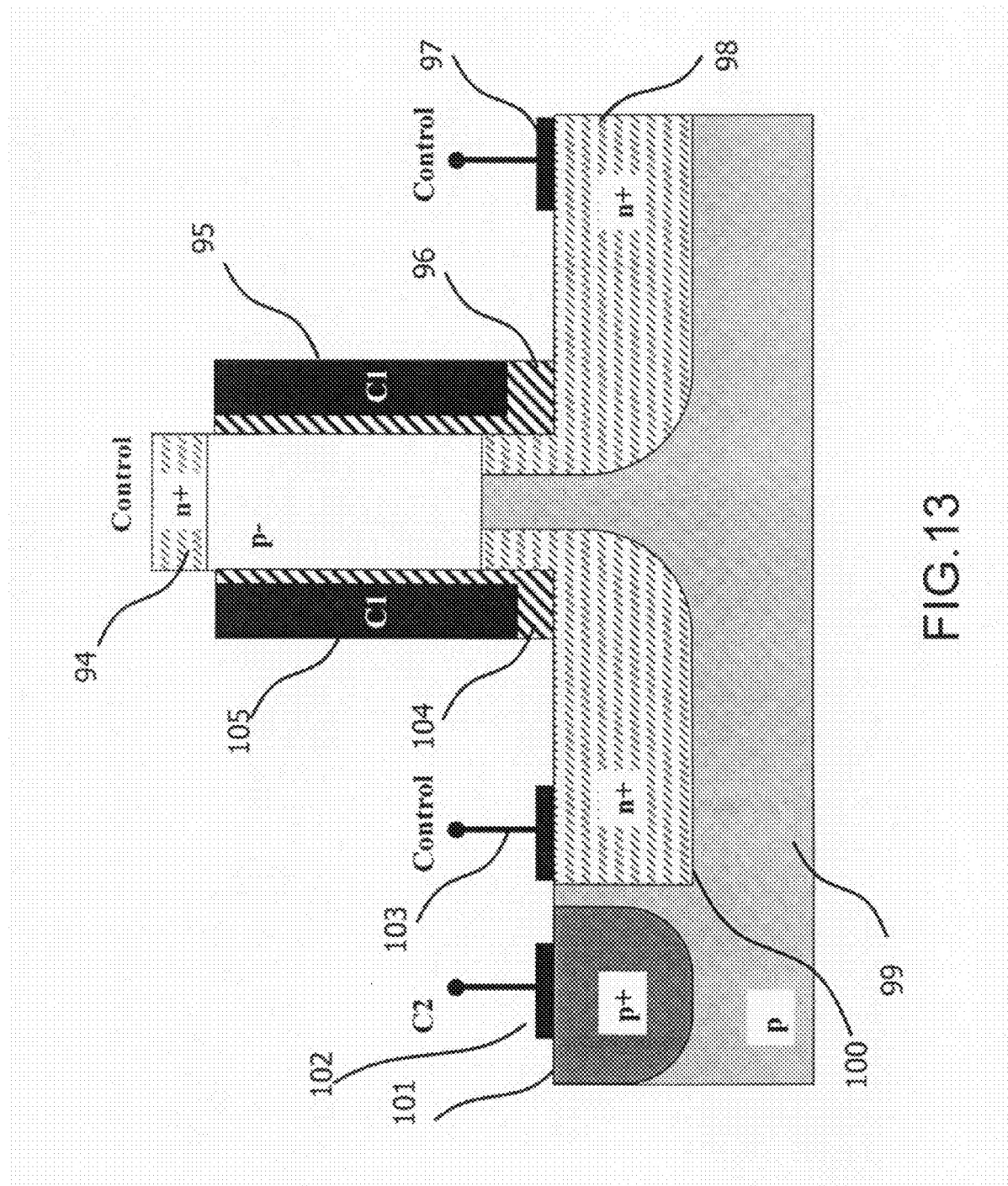
FIG. 13 shows a cross section view of a semiconductor variable capacitor with multiple control regions of a further embodiment of the invention, built in vertical configuration.

FIG. 13 is depicting the cross-section view of a semiconductor variable capacitor according to a further embodiment of the invention. This structure is similar to the one shown in FIG. 13, with the difference that the two p+ regions have been replaced by n+ control regions 100 and 98. This structure behaves similarly to the one shown in FIG. 3, but it has a higher specific capacitance.

N FIG. 14

Figure 14:
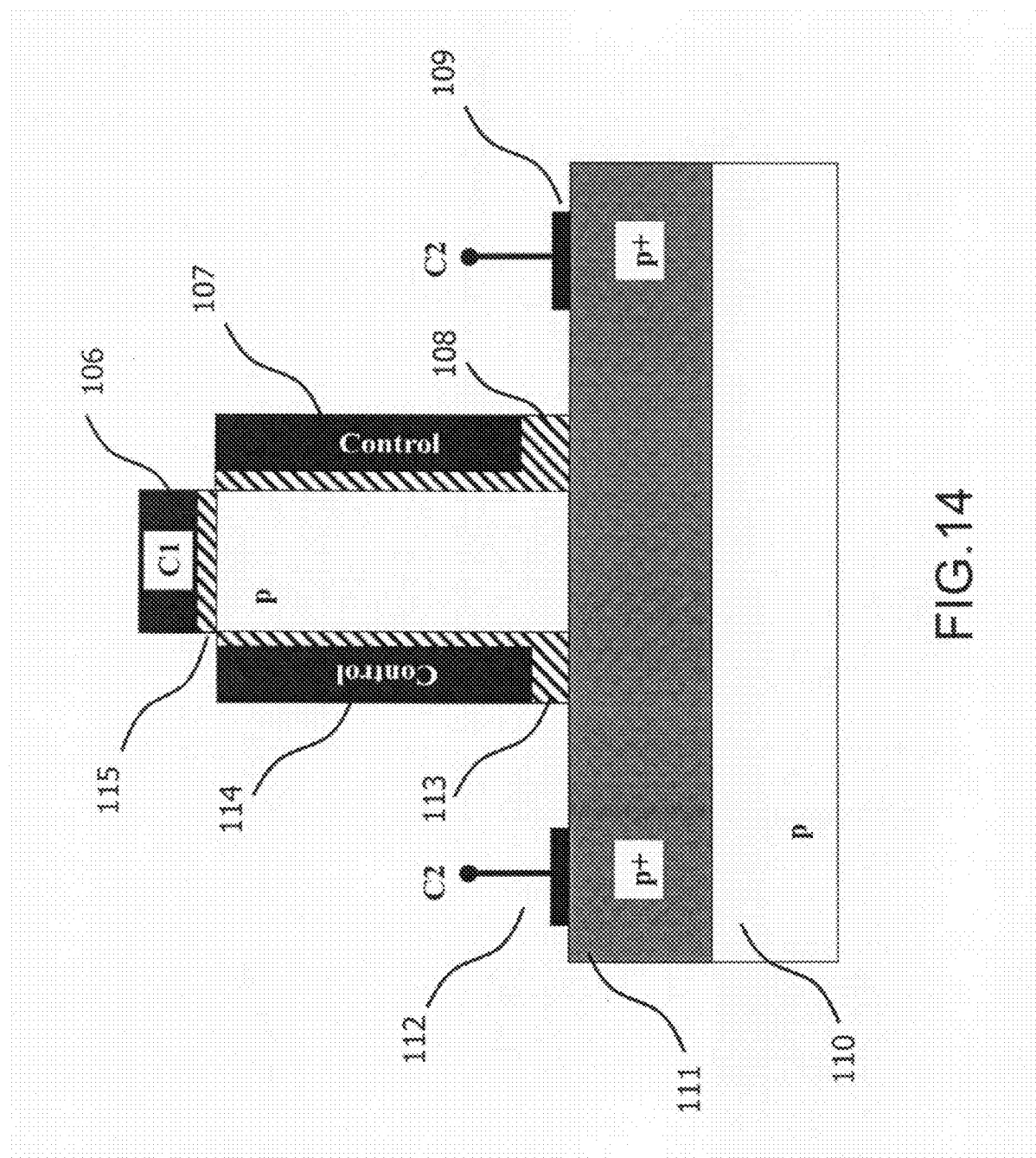
FIG. 14 shows a cross section view of a semiconductor variable capacitor according to a further embodiment of the invention, where the control regions are formed with metal-oxide electrodes.

FIG. 14 is depicting the cross-section view of a semiconductor variable capacitor according to a further embodiment of the invention. This structure is similar to the one shown in FIG. 12, with the difference that the capacitance electrode C1 106 and the capacitance dielectric 115 have been placed above the semiconductor pillar, and the n+ control regions have been replaced with metal-oxide (or poly silicon-oxide) electrodes 107 and 114.

O FIG. 15

Figure 15:
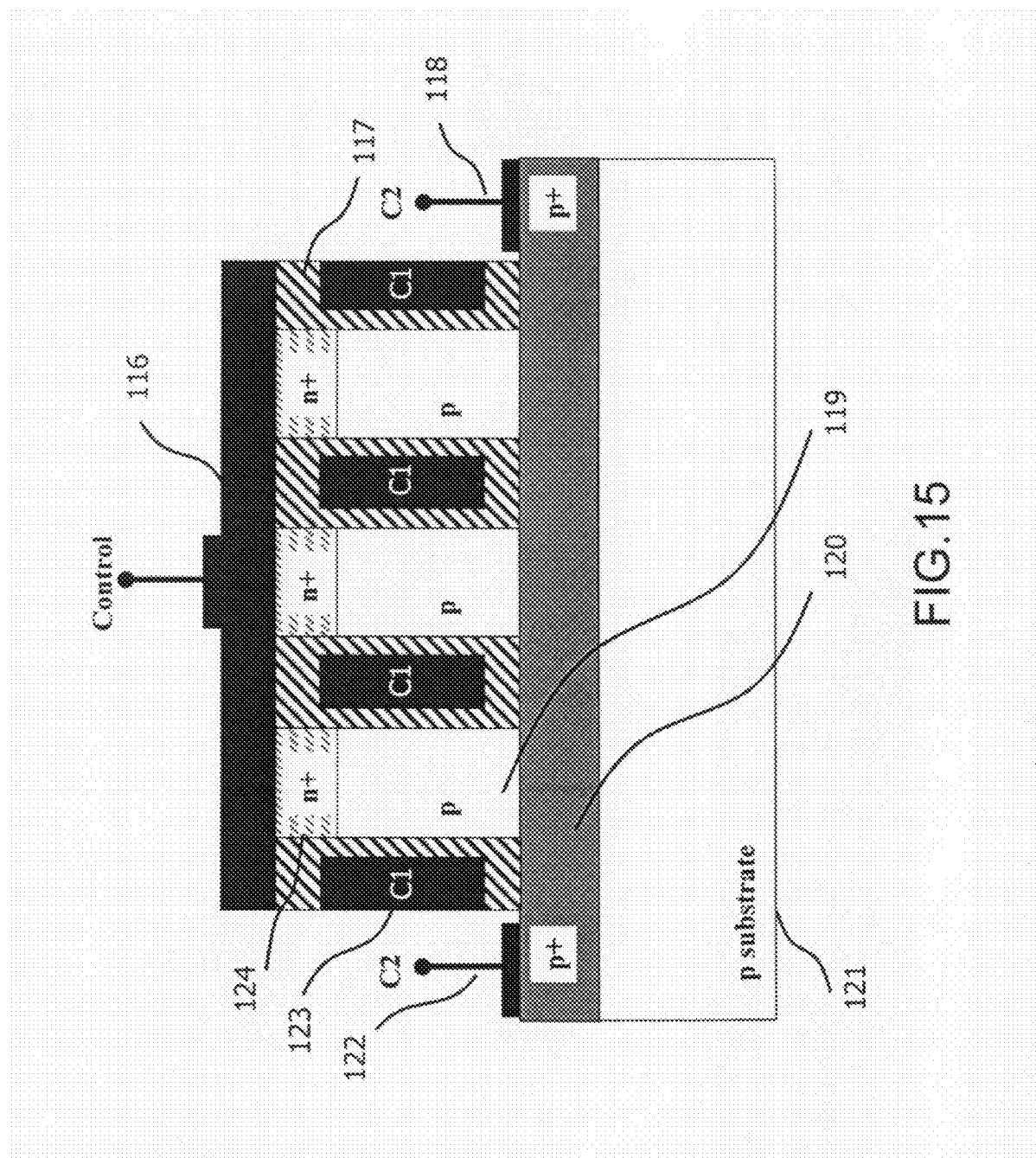
FIG. 15 shows a cross section view of a semiconductor variable capacitor according to a further embodiment of the invention, in multi-pillar configuration.

FIG. 15 is depicting the cross-section view of a semiconductor variable capacitor according to a further embodiment of the invention. This structure is composed by multi semiconductor pillars and it is the result of the combination of multiple structures, each resembling the one illustrated in FIG. 12. The use of a multi-pillar configuration allows a drastic increase of the specific capacitance of the device.

The C2 region p+ 120 can be also divided in several regions in order to simplify the fabrication process. In this case the final structure is obtained by simply placing several structures like the one illustrated in FIG. 12, next to each other. A similar structure can be obtained using the embodiment of FIG. 13 or FIG. 14.

P FIG. 16

Figure 16:
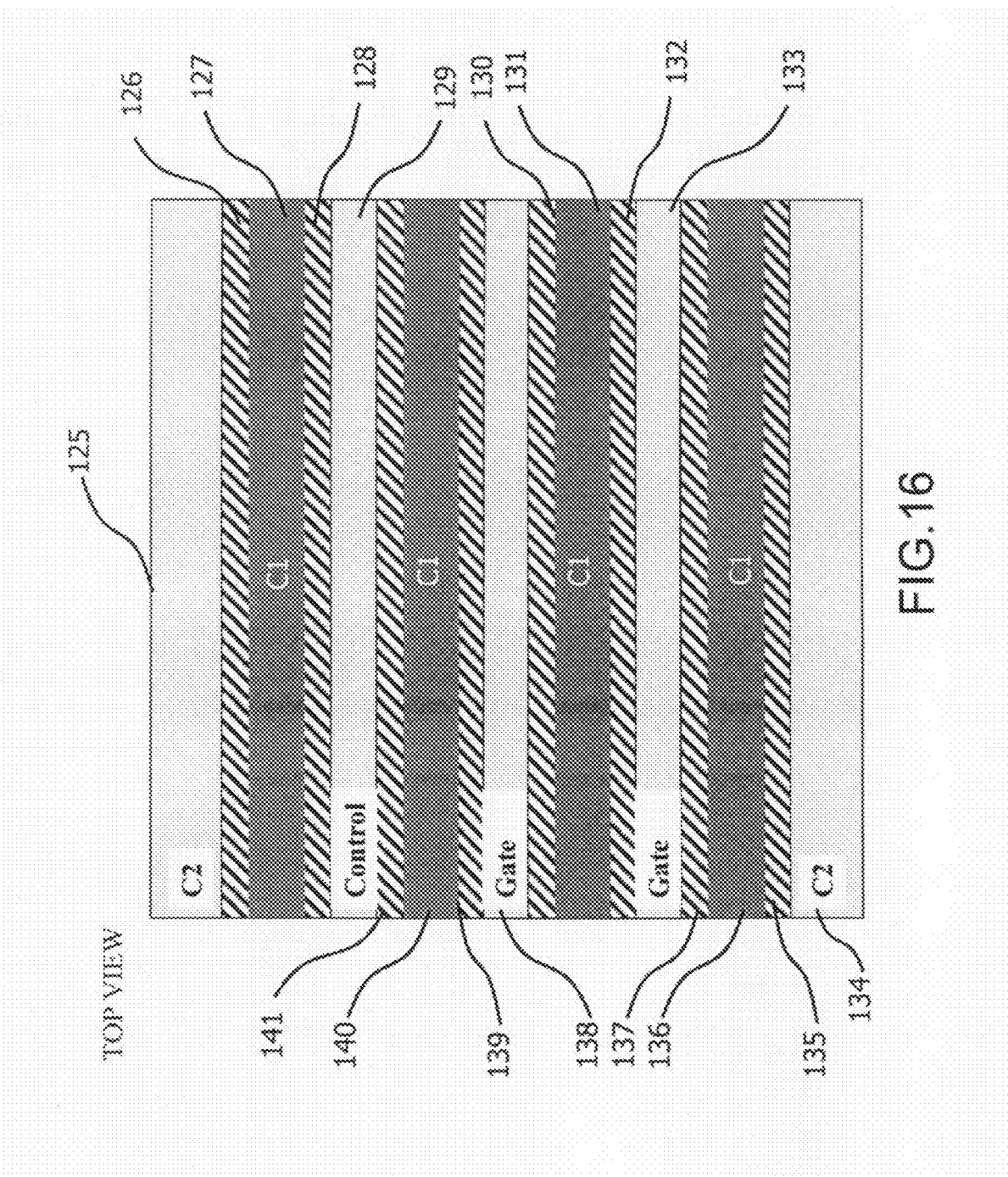
FIG. 16 shows, a top view of the layout of a semiconductor variable capacitor according to a further embodiment of the invention, in parallel plate configuration.

FIG. 16 is depicting a possible layout configuration for the structure of FIG. 15 using a parallel plate configuration. In such structure, each capacitance plate is in common between only two semiconductor pillars.

Aside from the parallel plate configuration of FIG. 16, the present invention can be realized with many different pillar shapes. Each semiconductor pillar of the device can have three, four, six or more walls.

Q FIG. 17

Figure 17:
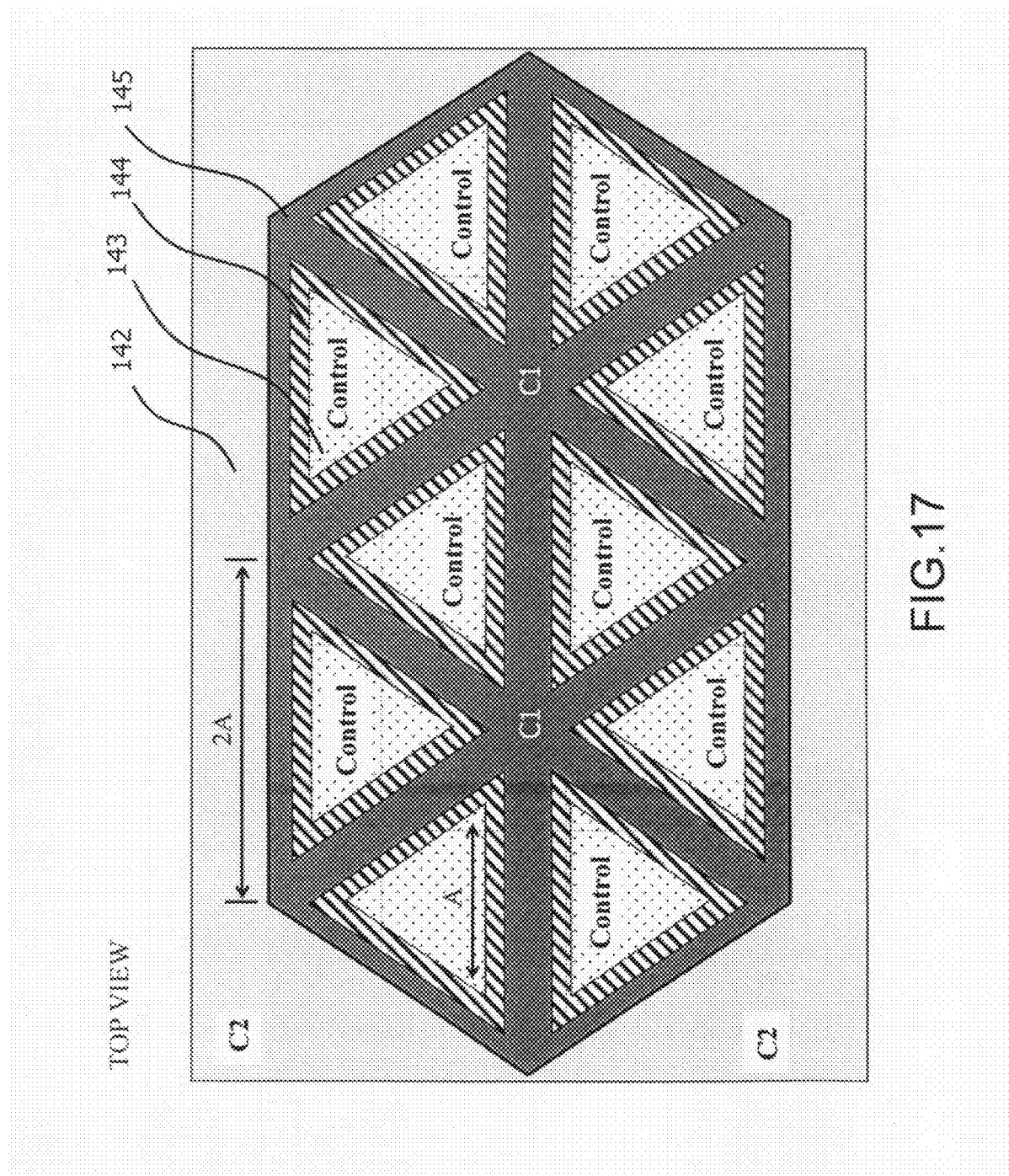
FIG. 17 shows a top view of the layout of a semiconductor variable capacitor according to a further embodiment of the invention, with triangular pillars.

FIG. 17 shows the top view of a further embodiment of the invention. In this structure the semiconductor pillars have a triangular cross section which leads to a very high capacitance per unit area. As it can be seen, the resulting structure is very compact. The silicon area between the pillars is fully utilized, and the number of vertical capacitive plate-walls per silicon area is maximized.

R FIG. 18

Figure 18:
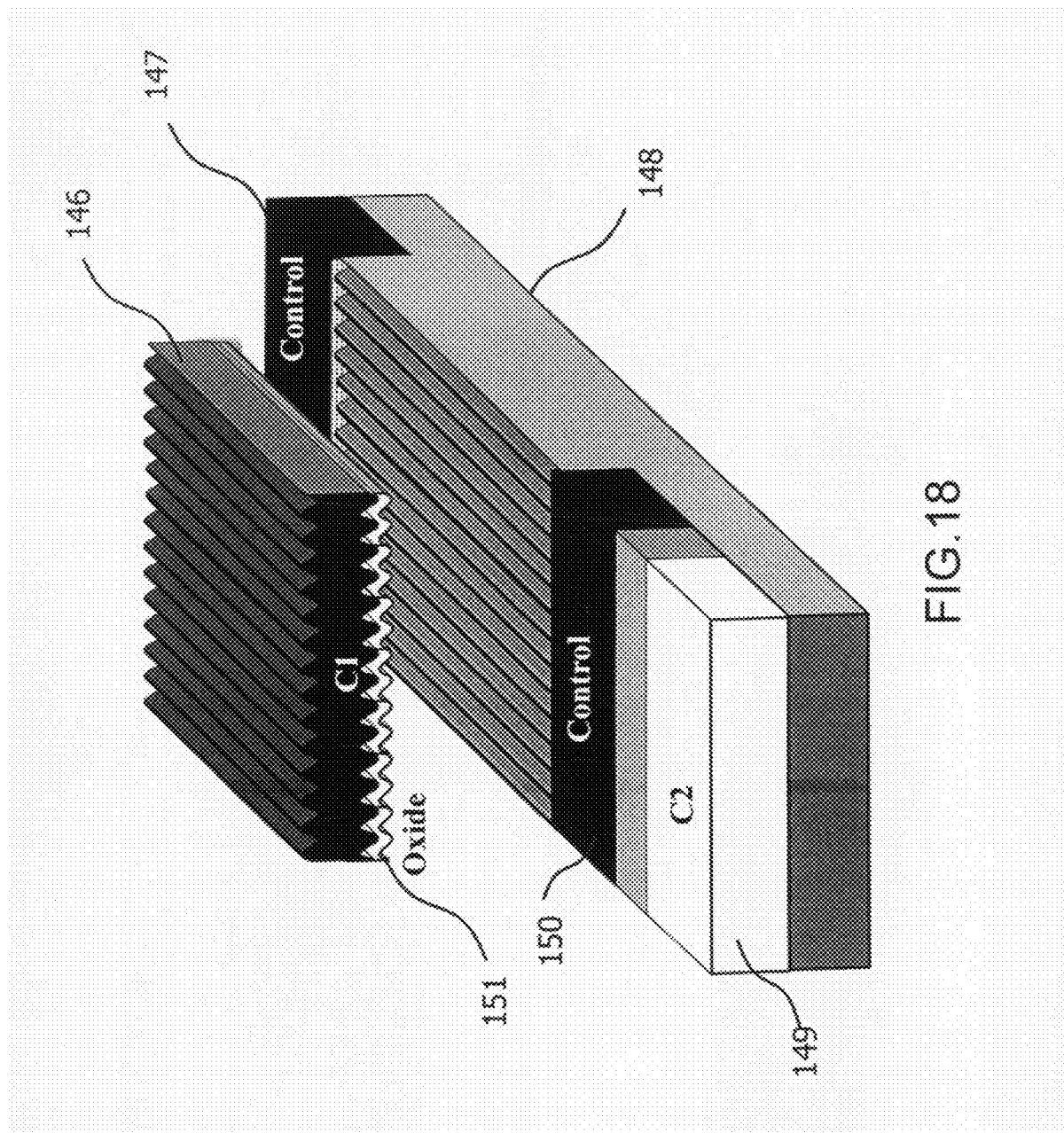
FIG. 18 shows a semiconductor variable capacitor according to a further embodiment of the invention, with a not planar capacitance surface.

FIG. 18 shows the further embodiment of the invention. This structure is similar to the one illustrated in FIG. 3, with the exception that the substrate surface under the capacitance electrode C1 and the surface of the capacitor dielectric are not flat. The capacitance surface has a periodic pattern in the direction parallel to the depletion region variation between the two n+ regions 147 and 149, such that a characteristic pattern, which repeats itself in regular intervals, can be identified. Also in this configuration it is possible to achieve a very high capacitance per unit area.

The illustrated embodiment defines a semiconductor variable capacitor with a total capacitance area much larger than the equivalent planar area, which leads to a significant increase of the specific capacitance of the device. Furthermore, since the device contacts are compressed in much less space, the parasitic resistances associated with the device terminals are significantly reduced.

S FIG. 19

Figure 19:
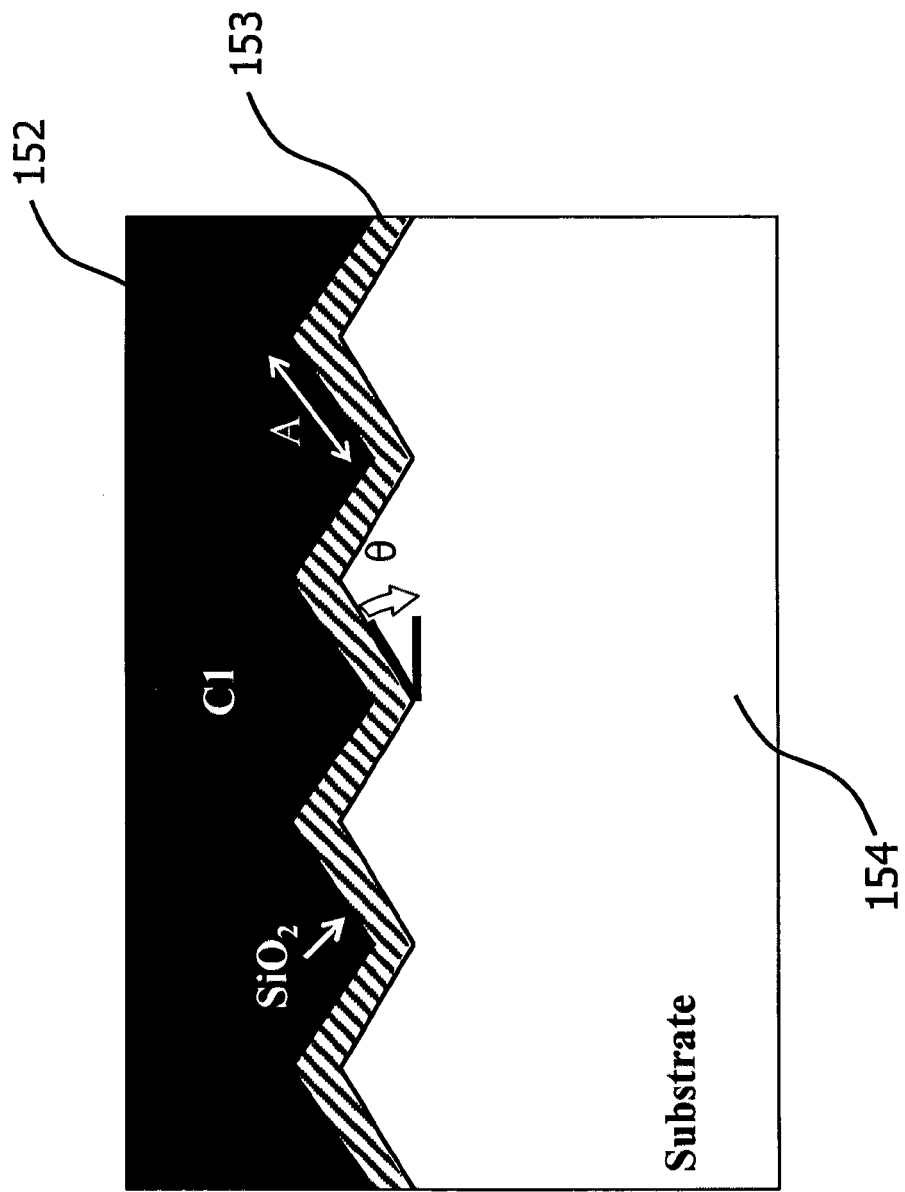
FIG. 19 shows a cross-section of a semiconductor variable capacitor according to a further embodiment of the invention, with the capacitance surface shaped with a triangular pattern.

The periodic pattern of the capacitance surface can have several geometric shapes such as triangular, trapezoidal, square, sinusoidal and others. FIG. 19 illustrates the cross-section of a further of the invention where the periodic pattern of the capacitance surface has a triangular shape.

For both the vertical and the non planar surface embodiments of the present invention the fabrication process is very similar to the standard CMOS one. Both of them can be obtained with a simple extra process step. The substrate surface can be shaped as desired, by means of a simple silicon etching step at the beginning of the MOS process. The other process steps (implantations, oxide thermal growth, and polysilicon deposition) remain unchanged with respect to a conventional CMOS process. This feature makes these embodiments very cost attractive.

T FIG. 20

Figure 20:
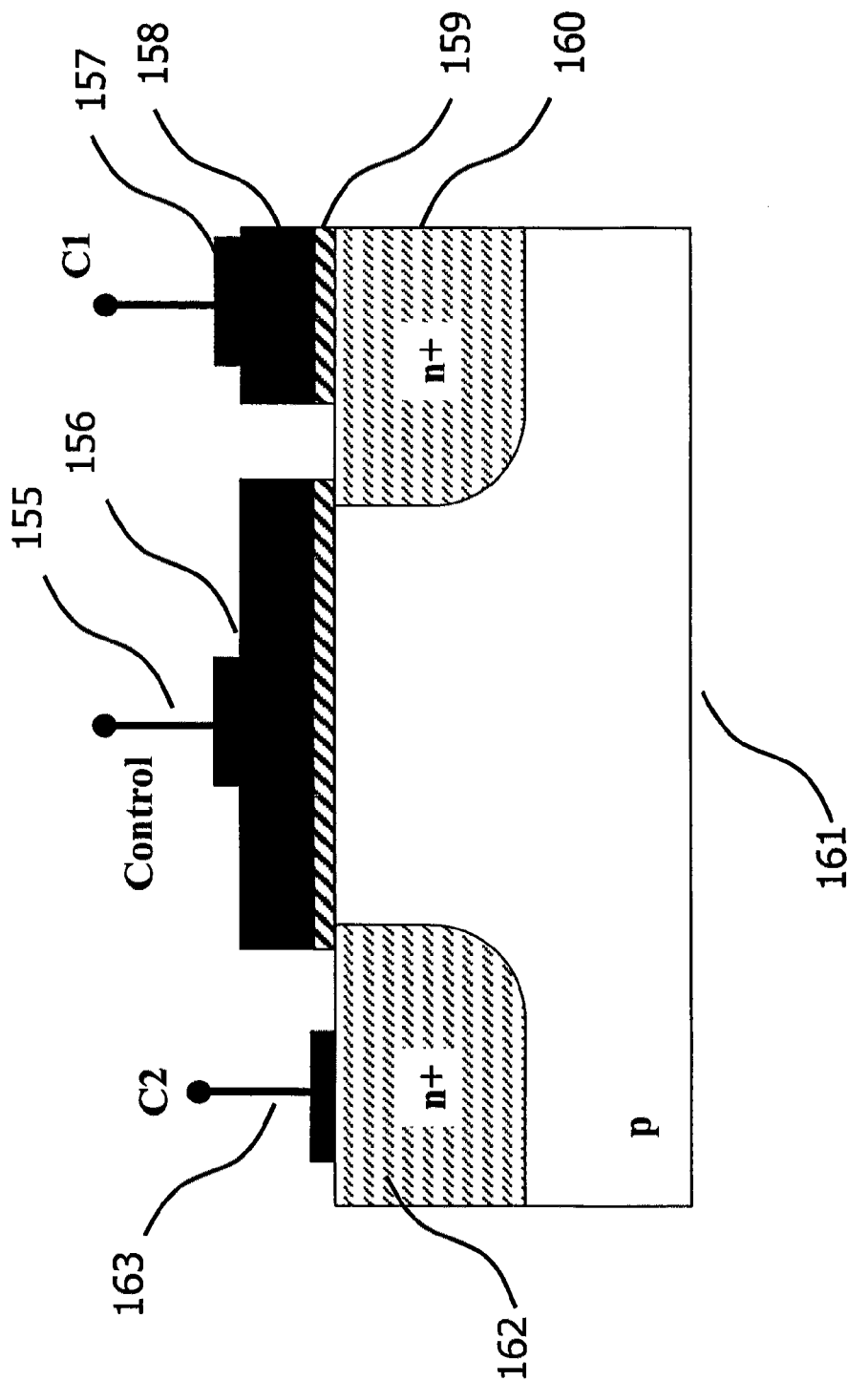
FIG. 20 shows a cross section view of a semiconductor variable capacitor according to a further embodiment of the invention.

FIG. 20 is depicting the cross-section view of a semiconductor variable capacitor according to a further embodiment of the invention. This structure is similar to the ones described above, with the difference that in this case the control terminal is composed by a metal-oxide (or poly-silicon-oxide) electrode 156 and it partially overlaps two n+ regions 160 and 162 forming a field effect device. The capacitor plate 158, along with the capacitor dielectric 159, has been placed directly above the n+ region 160. In this case a much higher capacitance per unit area can be obtained. Furthermore, the capacitance value is completely independent from the voltage between the C1 and C2 terminals. However, the useful range of the control voltage to vary the capacitance is drastically reduced.

In order to overcome this problem, several structures as the one illustrated in FIG. 20 can be connected in parallel in order to obtain a digitally variable capacitor. Using a digital control system for the different control terminals of the resulting array structure, it is possible to obtain a very efficient variable capacitor with a wide range of capacitance values. The total capacitance of the system is directly proportional to the number of FET turned on in the array.

The structure shown in FIG. 20 can be realized also with a wrinkled configuration resembling the one illustrated in FIG. 18. The simplicity of the device and its extremely high compatibility with a standard CMOS process, make the present invention a very attractive solution.

U FIG. 21

Figure 21:
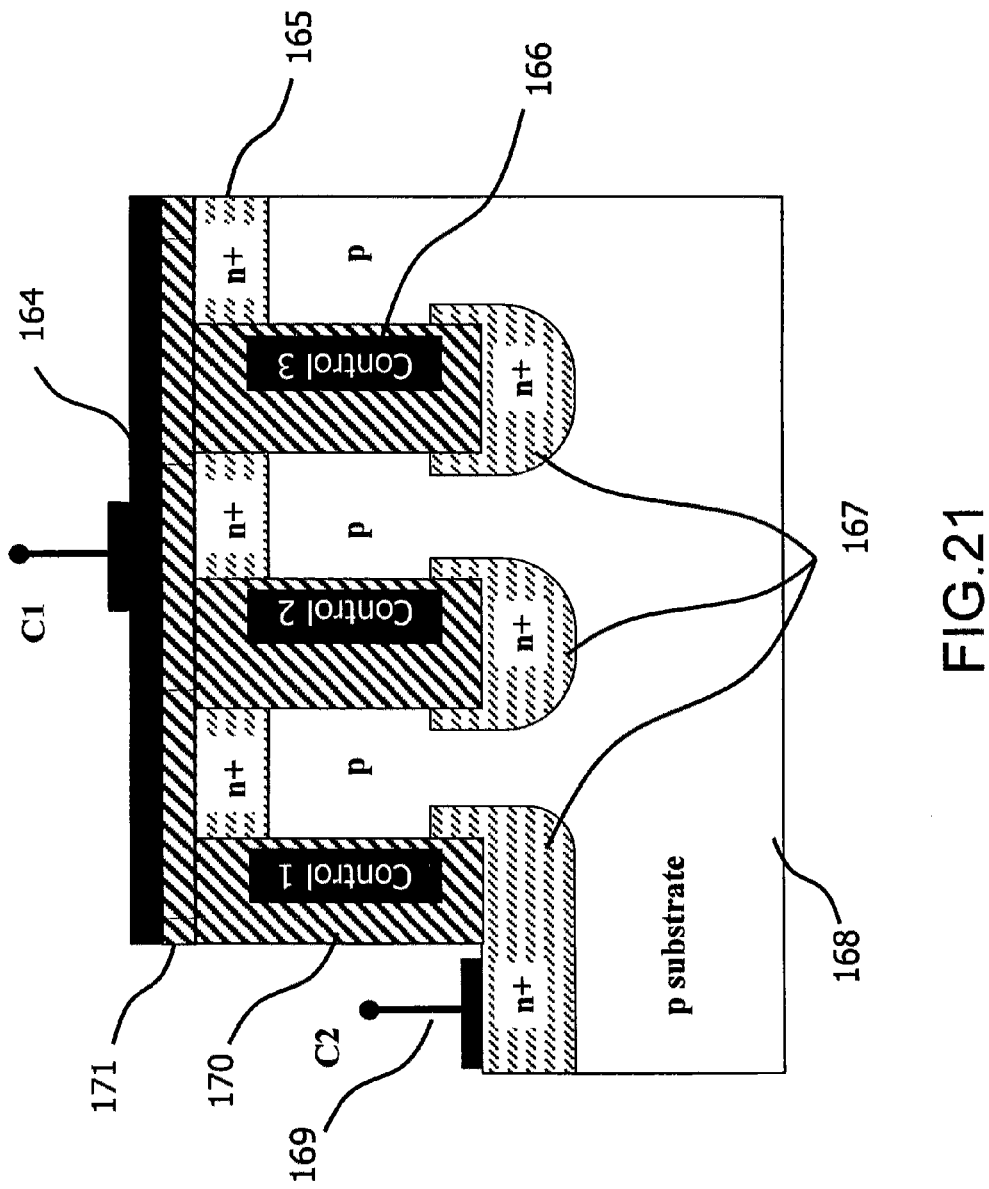
FIG. 21 shows a cross section view of a semiconductor variable capacitor according to a further embodiment of the invention.

Another example of embodiment of the present invention is reported in FIG. 21, where an array of vertical MOS structures with an extra metal oxide electrode above the source/drain region is illustrated. The n+ regions 167 are short circuited all together in the (not showed) third dimension of the structure to the C2 terminal. As it can be seen the resulting structure is very compact and allows many degrees of freedom in the design.

In the particular embodiment illustrated, each control terminal modulates only one channel however, many other variants such as comprising gate all around configurations are possible.

If desired, each control terminal can modulate two parallel channels, and/or the n+ regions 167 can be replaced with a single n+ region crossing the bases of all semiconductor pillars.

For all the device structures described above, the dual version can be obtained by simply substituting the n-doped implants with p-type ones and vice-versa. Furthermore, many other configurations can be obtained mixing the different embodiments and their variants.

As known to anyone skilled in the art, in all the structures described above, many doping profiles are possible for the substrate. For all the device structures described above, the dual version can be obtained by simply substituting the n-doped implants with p-type ones and vice-versa. Furthermore, the pn-junctions used to modulate the area of the equivalent capacitance plates of the capacitance in the different embodiments, can be replaced with Schottky contacts by simply substituting the control regions (such as, for example, region 5 in FIG. 1, or region 14 and 16 in FIG. 2 or region 93 in FIG. 12) with metal regions (with an opportune work function). Similar observations can be made for the metal-insulator (or poly silicon-insulator) electrodes of FIG. 14, which can be replaced with pn-junctions or Schottky contacts.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A semiconductor variable capacitor comprising:
    a first and a second equivalent capacitance plate;
    at least one control region;
        wherein the capacitance value between said first and second equivalent capacitance plate of said semiconductor variable capacitor is varied by varying a control voltage;
        wherein said control voltage is applied between said control regions and one of said first and second equivalent capacitance plate;
        where in said control voltage can be varied without altering the voltage between said first and second equivalent capacitance plate of said semiconductor variable capacitor;
        wherein said control region forms a rectifying junction with at least one of said first and second equivalent capacitance plate; and
        wherein said control voltage is applied across said rectifying junction.

2. The semiconductor variable capacitor of claim 1, wherein the capacitance value between said first and second equivalent capacitance plate is varied by varying an equivalent conductive surface of at least one of said first and second equivalent capacitance plate of said semiconductor variable capacitor, by means of depleting or enhancing at least a portion of the semiconductor material in physical contact with the capacitance dielectric layer of said semiconductor variable capacitor, and
wherein said control voltage is used to modulate said equivalent conductive surface of at least one of said first and second equivalent capacitance plate.

3. The semiconductor variable capacitor of claim 1, comprising:
a semiconductor region wherein said control regions is formed;
at least one capacitance dielectric layer covering at least a portion of a surface of said semiconductor region;
a conductive region covering at least a portion of a surface of said capacitance dielectric layer;
wherein said semiconductor region and said conductive region form said first and second equivalent capacitance plate of said semiconductor variable capacitor.

4. The semiconductor variable capacitor of claim 1, comprising:
a first semiconductor region, wherein said control regions is formed;
at least one capacitance dielectric layer covering at least a portion of a surface of said first semiconductor region;
a second semiconductor region covering at least a portion of a surface of said capacitance dielectric layer;
at least one additional control region in physical contact with said second semiconductor region;
wherein said additional control regions forms a rectifying junction with said second semiconductor region, and
wherein said first semiconductor region and said second semiconductor region form said first and second equivalent capacitance plate of said semiconductor variable capacitor.

5. The semiconductor variable capacitor of claim 1, comprising:
a semiconductor region, wherein said control regions is formed;
a multiplicity of pillar structures in physical contact with said semiconductor region;
wherein said multiplicity of pillar structures is comprising pillar structures coupled in parallel;
wherein the equivalent capacitance value of said semiconductor variable capacitor is varied by modulating through a depletion region, generated by said control voltage, the electrical insulation of at least one of said pillar structures coupled in parallel from said semiconductor region, and
whereby the electrical insertion of a number of said pillar structures coupled in parallel determines the equivalent capacitance of said semiconductor variable capacitor.

6. The semiconductor variable capacitor of claim 1, comprising:
a semiconductor region wherein said control regions is formed;
a multiplicity of pillar structures in physical contact with said semiconductor region;
wherein said multiplicity of pillar structures is comprising pillar structures coupled in parallel;
wherein the equivalent capacitance value of said semiconductor variable capacitor is varied by modulating through a depletion region, generated by said control voltage, the electrical insulation of at least one of said pillar structures coupled in parallel from said semiconductor region;
whereby the electrical insertion of a number of said pillar structures coupled in parallel determines the equivalent capacitance of said semiconductor variable capacitor;
at least one high conductivity region in a upper portion of at least one of said pillar structures;
at least one capacitance dielectric layer formed above at least a portion of at least one of said pillar structures, and
at least one conductive region covering at least a portion of a surface of said capacitance dielectric layer.

7. The semiconductor variable capacitor of claim 1, comprising:
at least one semiconductor pillar formed in a semiconductor region;
wherein said semiconductor pillars are directly coupled in parallel when a multiplicity of pillars is present, and
wherein the capacitance value of said semiconductor variable capacitor is varied by varying the depletion region within at least one of said semiconductor pillars.

8. The semiconductor variable capacitor of claim 1, comprising:
at least one semiconductor pillar formed in a semiconductor region;
wherein said semiconductor pillars are directly coupled in parallel when a multiplicity of pillars is present;
wherein the capacitance value of said semiconductor variable capacitor is varied by varying the depletion region within at least one of said semiconductor pillars;
at least one capacitance dielectric layer covering at least a portion of at least one of said semiconductor pillars;
at least one conductive region covering at least a portion of a surface of said capacitance dielectric layer;
wherein at least one of said semiconductor pillars comprises a semiconductor region,
and
whereby the equivalent capacitance value of said semiconductor variable capacitor is varied by varying the depletion region within at least one of said semiconductor pillars.

9. The semiconductor variable capacitor of claim 1, comprising a capacitance dielectric layer;
wherein at least a portion of said capacitance dielectric layer is not planar;
wherein the cross section of at least a portion of said capacitance dielectric layer is shaped in a periodic pattern, and
whereby said shaping of said capacitance dielectric layer provides a higher capacitance per semiconductor unit area of said semiconductor variable capacitor with respect to a substantially equivalent planar structure.

10. The semiconductor variable capacitor of claim 1, comprising:
a semiconductor region wherein a first and a second control region are formed;
a capacitance dielectric layer formed above at least a portion of a region comprised between said first and second control regions;
a conductive region formed above at least a portion of said capacitance dielectric layer;

wherein at least a portion of said capacitance dielectric layer is not planar;

wherein at least a portion of said capacitance dielectric layer is shaped in a periodic pattern in the direction perpendicular to the straight line connecting said first and second control region, and whereby said shaping of said capacitance dielectric layer provides a higher capacitance per semiconductor unit area of said semiconductor variable capacitor with respect to a substantially equivalent planar structure.

* * * * *